(12) United States Patent
Henry

(10) Patent No.: US 11,394,370 B2
(45) Date of Patent: Jul. 19, 2022

(54) METHOD AND SYSTEM FOR ULTRA-NARROWBAND FILTERING WITH SIGNAL PROCESSING USING A CONCEPT CALLED PRISM

(71) Applicant: Oxford University Innovation Limited, Oxford (GB)

(72) Inventor: Manus Henry, Oxford (GB)

(73) Assignee: OXFORD UNIVERSITY INNOVATION LIMITED

( * ) Notice: Subject to any disclaimer, the term of this patent is extended or adjusted under 35 U.S.C. 154(b) by 127 days.

(21) Appl. No.: 17/050,945

(22) PCT Filed: Apr. 30, 2019

(86) PCT No.: PCT/EP2019/061119
§ 371 (c)(1),
(2) Date: Oct. 27, 2020

(87) PCT Pub. No.: WO2019/211309
PCT Pub. Date: Nov. 7, 2019

(65) Prior Publication Data
US 2021/0234536 A1    Jul. 29, 2021

(30) Foreign Application Priority Data

Apr. 30, 2018 (GB) ................................. 1807064

(51) Int. Cl.
*H03H 17/02* (2006.01)
*H03H 17/04* (2006.01)
*H03H 17/00* (2006.01)

(52) U.S. Cl.
CPC .... *H03H 17/0277* (2013.01); *H03H 17/0286* (2013.01); *H03H 17/04* (2013.01); *H03H 2017/0081* (2013.01)

(58) Field of Classification Search
CPC ........... H03H 17/0081; H03H 17/0277; H03H 17/0286; H03H 17/04
See application file for complete search history.

(56) References Cited

U.S. PATENT DOCUMENTS

| 3,801,913 A | 4/1974 | Daguet et al. |
| 2015/0180436 A1 | 6/2015 | Tassart |

OTHER PUBLICATIONS

Henry et al., "The Prism: Efficient Signal Processing for the Internet of Things", IEEE Industrial Electronics Magazine, pp. 22-32. (Year: 2017).*

(Continued)

*Primary Examiner* — Chuong D Ngo
(74) *Attorney, Agent, or Firm* — Thomas|Horstemeyer, LLP

(57) ABSTRACT

Prism signal processing is a new FIR filtering technique that can offer a fully recursive calculation and elegant filter design. Its low design and computational cost may be particularly suited to the autonomous signal processing requirements for the Internet of Things. Arbitrarily narrow band-pass filters may be designed and implemented using a chain of Prisms and a simple yet powerful procedure. Using the described method and system, an ultra-narrowband filter can be evaluated in fractions of a microsecond per sample on a desktop computer. To achieve this update rate using a conventional non-recursive FIR calculation would require supercomputer resources. FPGA embodiments of the system demonstrate computation efficiency and broad applications of the technique.

20 Claims, 26 Drawing Sheets

(56) References Cited

OTHER PUBLICATIONS

Henry et al., "The Prism—Efficient signal processing for IoT applications", 22 pages. (Year: 2017).*
International Search Report and Written Opinion for WO 2019/211309 (PCT/EP2019/061119), dated Aug. 6, 2019, pp. 1-12.
International Preliminary Report on Patentability for WO 2019/211309 (PCT/EP2019/061119), dated Nov. 3, 2020, pp. 1-9.
Lehto et al., "Synthesis of Narrowband Linear-Phase FIR Filters With a Piecewise-Polynominal Impulse Response", IEEE Transactions on Circuits and Systems (2007).
Dutka., "Richardson Extrapolation and Romberg Integration", Historia Mathematica, (1984).
Henry et al., "An Introduction to Prism Signal Processing applied to Sensor Validation", Measurement Techniques (2018).
Henry et al., "Prism Signal Processing for Machine Condition Monitoring I: Design and Simulation", 1st IEEE International Conference on Industrial Cyber-Physical Systems (2018).
Henry et al., "Prism Signal Processing for Machine Condition Monitoring II: Design and Simulation", 1st IEEE International Conference on Industrial Cyber-Physical Systems (2018).
Leach et al., "Fast Coriolis mass flow metering for monitoring diesel fuel injection", Flow Measurement and Instrumentation, (2017).

* cited by examiner

METHOD AND SYSTEM FOR ULTRA-NARROWBAND FILTERING WITH SIGNAL PROCESSING USING A CONCEPT CALLED PRISM

CROSS-REFERENCE TO RELATED APPLICATIONS

This application is the National Stage of International Application No. PCT/EP2019/061119, filed Apr. 30, 2019, which claims priority to GB 1807064.9, filed Apr. 30, 2018, which are entirely incorporated herein by reference.

FIELD

The disclosed embodiments relate generally to systems and methods related to a computationally efficient ultra-narrowband bandpass filter.

BACKGROUND

Filters are used to extract a desired signal from a noisy signal. Infinite impulse response (IIR) filters are generally computationally efficient, but typically offer non-linear phase and gain characteristics, and are subject to numerical instability. Finite impulse response (FIR) filters can provide linear phase characteristics and are usually numerically stable, but generally require a high computational burden in order to deliver a given filtering performance, because they cannot in general use feedback to reuse previous computational effort. Filter design is complex and computationally expensive, and cannot generally be carried out in real-time within field devices, for example in order to adapt to the actual characteristics of the signal being filtered. Accordingly, it is difficult to ensure that filtering performance will be sufficient to facilitate accurate and/or computationally efficient sinusoid tracking, for example by ensuring that only one sinusoidal component is in the passband.

FIR filters can be more desirable due to their linear phase characteristics and numerical stability. FIR filters have been viewed as inherently non-recursive calculations, with only simple (e.g. the moving average filter), or elaborate and only partial exceptions. For example of partial exceptions, see "Synthesis of Narrowband Linear-Phase FIR Filters With a Piecewise-Polynomial Impulse Response", by Raija Lehto, Tapio Saramäki, and Olli Vainio, IEEE Transactions on Circuits and Systems—I: Regular Papers, vol. 54, no. 10, p 2262-2276, October 2007. FIR filters are normally formulated as discrete convolutions of the form:

$$y[n] = \sum_{i=0}^{N} b_i \cdot x[n-i] \qquad (1)$$

In the equation, the filter of order N generates an output sequence y[n] from the sum of products of the filter coefficients $b_i$ and the window of the N+1 most recent filter input values x[n-i], where i=0 . . . N. The calculation is non-recursive as the coefficients are positional: on the next time-step equation (1) must be repeated in full over the shifted data window.

Convolution calculations similar to equation (1) are so common in digital signal processing (DSP) that the multiply and accumulate (MAC) operation is a widely used metric of device performance. For example, equation (1) describes a calculation requiring N+1 MACs. To achieve real-time throughput at a sample rate of f Hz for an FIR filter of order N requires a computational performance of f·(N+1) MAC/s. Hence FIR filters, especially those of high order, can be computationally intensive.

Accordingly, a need exists for improved systems and methods that overcome the aforementioned obstacles and deficiencies of currently available filtering techniques.

SUMMARY

This disclosure presents new example embodiments of how Prism signal processing can provide flexible functionality in autonomous systems, e.g. through the design and instantiation of bandpass filters. Conventional filter design is resource intensive, and may be a significant impediment to autonomous signal processing in the field. This disclosure presents a powerful design procedure whereby a chain of Prisms can be used to implement a bandpass filter that has, within essential limits such as the Nyquist sampling limit, arbitrary central frequency and bandwidth. As disclosed, the procedure can be used to design and implement even ultra-narrowband filters. The same Prism signal processing characteristics are applicable to bandpass filtering: the design is simple even for very long filters, and the computational cost is low and independent of the filter length. Available memory constitutes a primary constraint on filter design. It is therefore feasible to consider the design and instantiation of new bandpass filters in real time on autonomous devices with modest computing resources.

Additional Aspects and Examples

In a first aspect, a method of applying a bandpass filter, comprising: instantiating a sequence of one or more Prism pairs, wherein two Prism filters in each Prism pair are characterized by a common harmonic number (h) and two different characteristic frequencies (m1, m2); selecting a bandwidth (b) of the bandpass filter; selecting a central frequency (c) of the bandpass filter; calculating, based on the bandwidth (b) and the central frequency (c), a value of the harmonic number (h) of each Prism pair; and calculating, based on the central frequency (c) and the harmonic number (h) of each Prism pair, values of the two characteristic frequencies (m1, m2) of each Prism pair.

In a second aspect, the method of aspect 1, wherein said calculating the values of the two characteristic frequencies (m1, m2) comprises selecting a value that produces a maximum frequency response at or near the central frequency (c) and selecting a value that produces a minimum frequency response at or near the central frequency (c).

In a third aspect, the method of aspect 1 or aspect 2, wherein said calculating the values of the two characteristic frequencies (m1. m2) includes calculating the characteristic frequency (m1) based on an equation m1=c/(h+$E_1$) and calculating the characteristic frequency (m2) based on an equation m2=c/(h−$E_2$), where $E_1$ and $E_2$ are constants.

In a fourth aspect, the method of aspect 3, wherein values of the constants $E_1$ and $E_2$ depend on the value of the harmonic number (h).

In a fifth aspect, the method of any one of aspects 1-4, wherein the two characteristic frequencies (m1, m2) correspond to Prism integral lengths that are integer numbers of samples.

In a sixth aspect, the method of aspect 3 or aspect 4, wherein the values of the constants $E_1$ and $E_2$ are both approximately 0.371, and wherein the value of the harmonic number (h) is greater than 20.

In a seventh aspect, the method of aspect 1, wherein the sequence of Prism pairs comprises a plurality of Prism pairs, and further comprising: selecting a ratio value for each of the plurality of Prism pairs.

In an eighth aspect, the method of aspect 7, wherein said calculating the value of the harmonic number (h) of each Prism pair is based on an integer rounding function of round(F×c/b×G), wherein G is the ratio value for the Prism pair, and F depends on a set of the ratio values and a minimum gain of the bandpass filter within a passband of the bandpass filter, wherein the passband extends from (c−b/2) to (c+b/2).

In a ninth aspect, the method of aspect 7 or aspect 8, wherein the plurality of Prism pairs consists of three Prism pairs.

In a tenth aspect, the method of aspect 9, wherein said selecting the ratio value for each of three Prism pairs comprises selecting one of three integer values 6, 4, and 3.

In an eleventh aspect, the method of aspect 10, wherein said calculating the value of the harmonic number (h) of each of the three Prism pairs is based on an equation h=round(0.0371×c/b×G), wherein round is an integer rounding function, and G is the ratio value.

In a twelfth aspect, the method of any one of the above aspects, further comprising: applying a signal at an input of the bandpass filter; obtaining a signal at an output of the bandpass filter; and calculating one or more of frequency, amplitude, power, and phase values of the signal obtained at the output of the bandpass filter.

In a thirteenth aspect, a system for applying a bandpass filter comprising means for carrying out the method of any one of the above aspects.

In a fourteenth aspect, an apparatus for bandpass filtering, comprising: one or more Prism pairs means concatenated in series, wherein two Prism filters means in each Prism pair means are characterized by a common harmonic number (h) and two different characteristic frequencies (m1, m2).

In a fifteenth aspect, the apparatus of aspect 14, wherein the two characteristic frequencies (m1, m2) correspond to a value that produces a positive peak in a frequency response of the apparatus for bandpass filtering at or near a central frequency (c) of the apparatus and a value that produces a negative peak in the frequency response at or near the central frequency (c).

In a sixteenth aspect, the apparatus of aspect 14 or aspect 15, wherein the harmonic number (h) is determined based on a bandwidth (b) of the apparatus for bandpass filtering and the central frequency (c), and wherein the characteristic frequencies (m1, m2) are determined based on the central frequency (c) and the harmonic number (h) of the apparatus for bandpass filtering.

In a seventeenth aspect, the apparatus of any one of aspects 14-16, wherein at least one Prism pair is implemented through computer instructions.

In an eighteenth aspect, the apparatus of any one of aspects 14-17, wherein at least one Prism pair is implemented through electronic circuit means.

In a nineteenth aspect, a system for signal tracking, comprising: a bandpass filter means, comprising: an input means; one or more Prism pair means being concatenated in series, wherein two Prism filter means in each Prism pair means are characterized by a common harmonic number (h) and two different characteristic frequencies (m1, m2), wherein the harmonic number (h) and the characteristic frequencies (m1, m2) are determined based on a bandwidth (b) of the bandpass filter means and a central frequency (c) of the bandpass filter means; and an output means; and a processing means being coupled to the output means of the bandpass filter means to obtain an output signal from the bandpass filter means and calculating one or more of frequency, amplitude, power, and phase values of the output signal.

In a twentieth aspect, the system of aspect 19, wherein each of the two characteristic frequencies (m1, m2) is determined based on a frequency response of the bandpass filter means.

In a twenty-first aspect, the system of aspect 19 or aspect 20, wherein the harmonic number (h) is based on a ratio of the central frequency (c) to the bandwidth (b).

Figure 1:
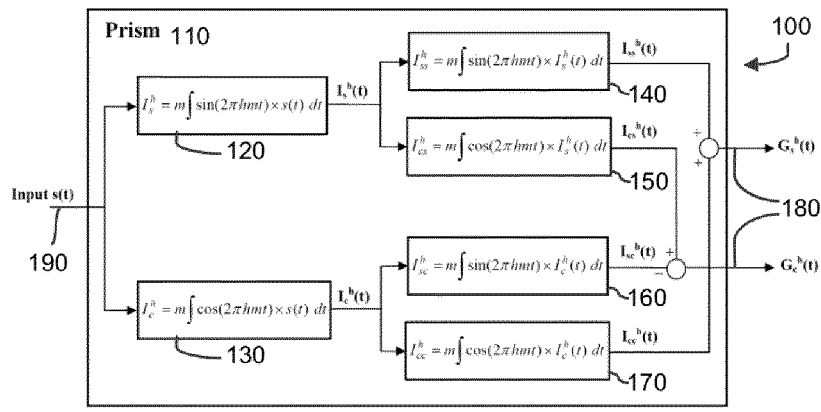
FIG. 1 is an exemplary graph illustrating the structure of Prism signal-process blocks.

It should be noted that the figures are not drawn to scale. It also should be noted that the figures are only intended to facilitate the description of the embodiments. The figures do not illustrate every aspect of the described embodiments and do not limit the scope of the present disclosure.

DETAILED DESCRIPTION

The following descriptions of the various embodiments are exemplary and not intended to limit the scope of the claims.

The Prism

An embodiment of the Prism constitutes a low pass FIR filter (or as a coupled pair of filters) that can use a recursive sliding window technique, so that the computation burden is independent of the window length, with linear phase response and good numerical stability. The design process for the embodiment can be simple yet powerful, as it can use sinusoidal coefficients, and can be performed with limited computational resources. Thus it is possible to create new filters to match the observed signal characteristics, for example as these evolve over time or in response to an external request, even within a resource-limited field device. Two or more Prisms may be combined into a chain or network to match more sophisticated signal processing requirements, such as (static) notch filtering or band-pass filtering. Each Prism can be extended to provide a second output, where the two outputs are generally orthogonal (e.g., having a phase difference of π/2 radians). A variety of sinusoid trackers can be constructed to calculate estimates of the frequency, phase and/or amplitude of the monitored signal, each using a Prism network and a detection calculation. The resulting calculations may be simple, have low computational cost, and have accuracy results close to the Cramer-Rao lower bound, even for short window lengths and with a low signal-to-noise ratio. More sophisticated use of Prisms may include diagnostics, where the onset of new frequency components may be detected, and where appropriate new signal processing blocks may be created in real time to track the new components and minimize their impact on the tracking of the original components.

Embodiments of the Prism may include systems, utilizing mechanical or electronic sensors and/or microprocessors or other devices capable of computation, or methods using the disclosed techniques. The methods and systems utilizing an embodiment of the Prism perform double integrals of the form:

$$I_{[s|c]_h[s|c]_h} = \int_{-\frac{1}{m}}^{0} [\sin|\cos](2\pi hmt)\left(\int_{t-\frac{1}{m}}^{t} [\sin|\cos](2\pi hmt) \cdot s(t)dt\right)dt \quad \text{Equation (2)}$$

Here the notation [s|c] is used to indicate the selection of one alternative between s (for sine) and c (for cosine). h is the harmonic number, normally a small positive integer, usually 1 or 2. m may be the characteristic frequency of the Prism.

Although the mathematical analysis described in this disclosure may be stated in terms of continuous notation (for example using integration rather than summation), it will be understood by those familiar with the art that a practical implementation may be based upon digitally sampled signals, and that mathematical results in the continuous domain can, with due care, be mapped onto the discrete time domain. For example, Romberg Integration, (described in J. Dutka, "Richardson Extrapolation and Romberg Integration", Historia Mathematica, Vol. 11, (1984) pp 3-21), is one technique that may be applied to obtain accurate results from discrete samples of data, which may provide a good approximation to the theoretical value of the continuous integral equivalent.

With regard to the discrete-time implementation of an embodiment of the Prism, given a sampling rate fs, the choice of m is restricted to ensure that fs/m is an integer: this quantity gives the whole number of samples in each of the two data windows used for numerical integration. Where Romberg Integration is used, slightly greater restrictions are placed on the selected value of m, for example that fs/m must be a positive multiple of some power of two (for example 4n, where n is any positive integer).

Where the Prism is being used as part of a sinusoid tracking system, then typically m can be selected to be higher than the frequency range of the sinusoids to be tracked. For example, using a fixed sampling rate between 10 and 100 kHz, sinusoids in the range 50-180 Hz may be tracked using double integrals with a value of m at around 200 Hz.

The integral limits may be selected so that $\phi$, the phase of s(t) at t=0, is also the phase of the most recent sample. In other words, calculating $\phi$ can give the phase at the end of the data window, rather than (for example) the phase at the mid-point of the double integral. Note that the double integral extends in time from $-2/m$ to 0: its duration is $2/m$. Accordingly, viewed as an FIR filter, this embodiment can be considered as having an order (i.e., the length of the data window in samples) of 2 fs/m.

The harmonic number can be considered in the following terms. Over each integral window, the modulation function constitutes a sinusoid (either sine or cosine) that is multiplied by the input signal: for the inner integral, the input constitutes the original signal s(t); for the outer integral the input constitutes the value supplied as an output from the inner integral. When the harmonic number is one, one complete cycle of the modulation function can stretch over the window of data associated with each integral: thus the frequency of the modulation function is m. When the harmonic number is two, two cycles exactly cover each data window, and thus the frequency of the modulation function is 2 m, and so on.

Given that harmonic numbers 1 and 2 are most frequently applied, a simplified notation is used (except where stated): s and c are used to represent sin and cos with h=1, and z and k are used to represent sin and cos with h=2. Thus:

$$I_{ss} = \int_{-\frac{1}{m}}^{0} \sin(2\pi mt) \left( \int_{t-\frac{1}{m}}^{t} \sin(2\pi mt) \cdot s(t) dt \right) dt \quad \text{Equation (3)}$$

and $$I_{zk} = \int_{-\frac{1}{m}}^{0} \sin(4\pi mt) \left( \int_{t-\frac{1}{m}}^{t} \cos(4\pi mt) \cdot s(t) dt \right) dt \quad \text{Equation (4)}$$

Analytically, these integrals are equivalent to the following expressions:

$$I_{ss} = \frac{A}{m^2} \mathrm{sinc}^2(r) \frac{-3r^2}{(r^2-1)(r^2-4)} \sin(\phi - 2\pi r) \quad \text{Equation (5)}$$

and $$I_{zk} = \frac{A}{m^2} \mathrm{sinc}^2(r) \frac{2r(r^2+8)}{(r^2-4)(r^2-16)} \cos(\phi - 2\pi r) \quad \text{Equation (6)}$$

Here r is the frequency ratio of the input sinusoid, defined as:

$$r = f/m, \quad \text{Equation (7)}$$

so that r=0 when f=0 Hz and r=1 when f=m Hz. Typically r<1 for a sinusoid being tracked, but higher values of r may be important when considering the filtering properties of the Prism.

sinc(x) is the normalised sinc function defined as follows:

$$\mathrm{sinc}(x) = \frac{\sin(\pi x)}{\pi x} \quad \text{Equation (8)}$$

The utility of the double integral approach can be observed from these equations. By passing the signal through several different double integrals in parallel, a set of algebraically related functions may be calculated, from which the values of r (and hence f, as well as A and $\phi$) may be deduced. Also, some integrals in the family result in sine functions, and some in cosine functions. These properties are valuable, suggesting a strategy of constructing orthogonal pairs of integral values (analogous to the analytic function) from which to derive the sinusoid parameters A and $\phi$.

Both sine and cosine terms in equations 5 and 6 have a common delay term $2\pi r$. This is the linear phase delay characteristic of certain FIR filters where the time delay is 1/m, i.e. half the double integral length. Thus integrals of this type have the desired linear phase characteristic.

Before further consideration of algebraic solutions to this family of integral equations, it is necessary to address the issue of evaluating the numerical values of the double integral in an efficient manner. This results in a significant simplification of the algebraic form of the equations to be solved.

Evaluating double integrals numerically may require many calculations. For example, if the discrete, numerical equivalent of equation 3 were evaluated in a straightforward manner, the number of multiplications of signal value by modulating sine value would be the square of the number of samples in each integral. For, say 100 sample points, this would require 10,000 multiplications, even before any further calculations were performed to accumulate the double integral value. In some cases, this may be more than the processing power available for a calculation.

A common technique for reducing the computational load of calculations over a window of data is to use a sliding window technique combined with recursion. The algorithm can be rearranged so that the calculation at sample n+1 is based primarily on results previously calculated at sample n, typically by subtracting the contribution of the oldest value in the window and adding in the contribution of the newest. Applying this technique to an integration (or indeed a double integration) calculation can be potentially straightforward. Given the particular form of integral under consideration, however, a potential difficulty may arise in forming the product of the signal and the modulating sine or cosine value. Equation 3 implies that the initial phase of each of the modulating sine functions is zero for each integral. This in turn implies recalculating the product of signal and modulation function across the whole integral for each new sample. To apply a recursive sliding window approach to equation 3, it may be necessary for the modulating function to 'slide with' the signal, so that all (but the oldest) of the signal/modulation function products at time step n remain valid for time step n+1.

This requirement can be expressed mathematically by introducing an additional variable, q, which represents the initial phase of the modulating functions, no longer assumed to be zero. As both integrals have the same length, there is no loss of generality to assume that the phase offset is the same for both. Thus, the definition of $I_{ss}$ given in equation 5 could be generalised to:

$$I_{ss} = \int_{-\frac{1}{m}}^{0} \sin(2\pi mt + q) \left( \int_{t-\frac{1}{m}}^{t} \sin(2\pi mt + q) \cdot s(t) dt \right) dt \quad \text{Equation (9)}$$

In an efficient discrete time instantiation, the values of q may be restricted to the set $2\pi \times k \times m/fs$ radians (modulo $2\pi$), where k=0, 1, 2, ... window length−1, so that the modulation function values sin(2πmt+q) (as well as cos(2πmt+q)) are fixed values that can be calculated once when the Prism is instantiated, in order to be stored and then continuously reused throughout the operation of the Prism. In this case, q represents the phase of the first modulation function value of any particular integral, where the same fixed modulation function values are cycled through from that initial point.

Introducing q into the definitions of the integral family may result in analytic expressions for the double integrals which may retain a dependency on q and therefore are not amenable to the proposed recursive calculation. Fortunately, however, the combination or grouping of certain pairs of integrals yields simple analytic results which are independent of q. These groups can facilitate the use of a recursive sliding windows calculation that may significantly reduce the computational effort required to numerically evaluate the double integrals.

Given the revised definition of $I_{ss}$ in equation 9, and the corresponding definition of $I_{cc}$:

$$I_{cc} = \int_{-\frac{1}{m}}^{0} \cos(2\pi mt + q)\left(\int_{t-\frac{1}{m}}^{t} \cos(2\pi mt + q) \cdot s(t)dt\right)dt \quad \text{Equation (10)}$$

Then the group $G_s$ formed from their sum has a simple analytic expression which can be independent of q.

$$G_s = m^2(I_{ss} + I_{cc}) = A\operatorname{sinc}^2(r)\frac{r^2}{r^2 - 1}\sin(\phi - 2\pi r) \quad \text{Equation (11)}$$

Similarly, defining integrals $I_{sc}$ and $I_{cs}$ as follows:

$$I_{sc} = \int_{-\frac{1}{m}}^{0} \sin(2\pi mt + q)\left(\int_{t-\frac{1}{m}}^{t} \cos(2\pi mt + q) \cdot s(t)dt\right)dt \quad \text{Equation (12)}$$

and $$I_{cs} = \int_{-\frac{1}{m}}^{0} \cos(2\pi mt + q)\left(\int_{t-\frac{1}{m}}^{t} \sin(2\pi mt + q) \cdot s(t)dt\right)dt, \quad \text{Equation (13)}$$

then these integrals can be combined into a group $G_c$:

$$G_c = m^2(I_{cs} - I_{sc}) = A\operatorname{sinc}^2(r)\frac{r}{r^2 - 1}\cos(\phi - 2\pi r). \quad \text{Equation (14)}$$

So, by accepting the overhead of calculating two double integral pairs, simple analytic expressions can be obtained for the sum (or difference) of the integrals, where their numerical values can be calculated efficiently using sliding windows and recursion. The multiplication by the factor $m^2$ in equations 11 and 14 provides a convenient independence from m in the resulting analytic expressions. Note also that the pair $G_s$ and $G_c$ are orthogonal to one another and very nearly form an analytic function—they differ only by a factor r.

The results in equations 11 and 14 are the first in a series obtained for the integrals for higher harmonic numbers. Readopting the earlier h notation, and emphasising that the following results are true when the q term is included in the integral definitions, the following results can be found:

$$G_{s_h} = m^2(I_{s_h s_h} + I_{c_h c_h}) = A\operatorname{sinc}^2(r)\frac{r^2}{r^2 - h^2}\sin(\phi - 2\pi r) \quad \text{Equation (15)}$$

and $$G_{c_h} = m^2(I_{c_h s_h} - I_{s_h c_h}) = A\operatorname{sinc}^2(r)\frac{hr}{r^2 - h^2}\cos(\phi - 2\pi r) \quad \text{Equation (16)}$$

$G_{sh}$ in equation 15 is also referred to as $G_s^h$ in this disclosure.

These results have been verified using the Matlab® Computer Algebra toolbox for all h≤20. Note that for each harmonic number the close analogy between the two integral groups and an analytic function is preserved: in general the ratio between each pair (excluding the orthogonal sine/cosine functions) is r/h.

These simple analytic expressions for the double integral groups are central to the definition of the Prism. The Prism may be defined as a signal processing object that receives a time series signal as an input, and which generates, via numerical integration, one or more time dependent outputs. These time-dependent outputs may correspond to the sample-by-sample values of one or both of $G_{s_k}$ and $G_{c_k}$ as defined in equations 15 and 16. As discussed above, the Prism may have two primary configuration parameters, m and h. As a signal processing object, the Prism may be incorporated into systems and/or methods of detecting sinusoidal wave components.

Prism Signal Processing

Prism Signal Processing, described above and in "The Prism: Efficient Signal Processing for the Internet of Things," IEEE Industrial Electronics Magazine, pp 2-10, December 2017. DOI: 10.1109/MIE.2017.2760108 by M P Henry, F Leach, M Davy, O Bushuev, M S Tombs, F B Zhou, and S Karout, constitutes a new FIR technique particularly suited to the requirements of autonomous computing and for intelligent, adaptive components in Cyber-Physical Systems and the Internet of Things (IoT).

FIG. 1 shows an exemplary representation 100 of the Prism 110, which constitutes an FIR filter receiving an input 190 and generating one or two outputs 180. Its properties are defined by its characteristic frequency m and harmonic number h. Structurally, the Prism comprises six integration blocks 120-170, where the input to each is multiplied by a sine or cosine function with frequency h*m Hz and integrated over the period 1/m seconds to generate the corresponding output. This calculation can be performed recursively, as the final Prism outputs can be independent of the instantaneous phase of the sinusoidal modulation functions. In embodiments of the Prism, the equivalent of filter coefficients are linearly spaced sine and cosine values, so that, for desired values of m and h, the design calculation can be straightforward.

Prism signal processing can offer a unique combination of desirable properties: the calculation is FIR, and hence robust; the outputs have linear phase delay; the calculation is fully recursive so that the computational cost per sample is low and fixed, irrespective of the length of the filter; and its design can be straightforward, given desired values of m and h, requiring only the evaluation of linearly spaced sine and cosine values.

This design simplicity can enable new Prism networks to be created in real time in response to changes in signal processing requirements. "An Introduction to Prism Signal Processing applied to Sensor Validation," Measurement Techniques, pp 1233-1237, March 2018. DOI: 10.1007/ s11018-018-1345-1, by MP Henry, outlines a fault detection scheme in which the detection of an unwanted frequency component in a signal results in the construction of a new Prism network to filter out that component. "Prism Signal Processing for Machine Condition Monitoring I: Design and Simulation," 1st IEEE International Conference on Industrial Cyber-Physical Systems (ICPS-2018), May 2018, and "Prism Signal Processing for Machine Condition Monitoring II: Experimental Data and Fault Detection," 1st IEEE International Conference on Industrial Cyber-Physical Systems (ICPS-2018). May 2018, both by MP Henry and V Sinitsin, describe a condition monitoring scheme for rotating machinery, with two stages. The first stage monitors rotation startup. Once the steady rotation speed is established, in the second stage a set of Prism networks, including filtering elements, are instantiated to track six harmonics of the rotation frequency simultaneously.

The computational efficiency of Prism signal processing is illustrated in "Fast Coriolis mass flow metering for monitoring diesel fuel injection," Flow Measurement and Instrumentation, 58 (2017), pp 1-5, by F. Leach, S. Karout, F. B. Zhou, M. S. Tombs, M. Davy, and M. P. Henry, which describes a fuel injection monitoring application where flow measurements are generated at 48 kHz using modest computation hardware. The calculation, which includes the removal of unwanted signal components, enables the tracking of fuel pulses as short as 1 ms.

The Theory of Prism Bandpass Filter Design

In one embodiment, the bandpass-filter design uses a sequence of Prisms from each of which only one output, $G_s^h$ is used. Given m, the characteristic frequency of a Prism, and h its harmonic number, the gain of $G_s^h$ at frequency f is given by equation (17):

$$\text{gain}(f, m, h) = \text{sinc}^2(r) \frac{r^2}{r^2 - h^2}, \text{ where } r = f/m \quad (17)$$

Figure 2:
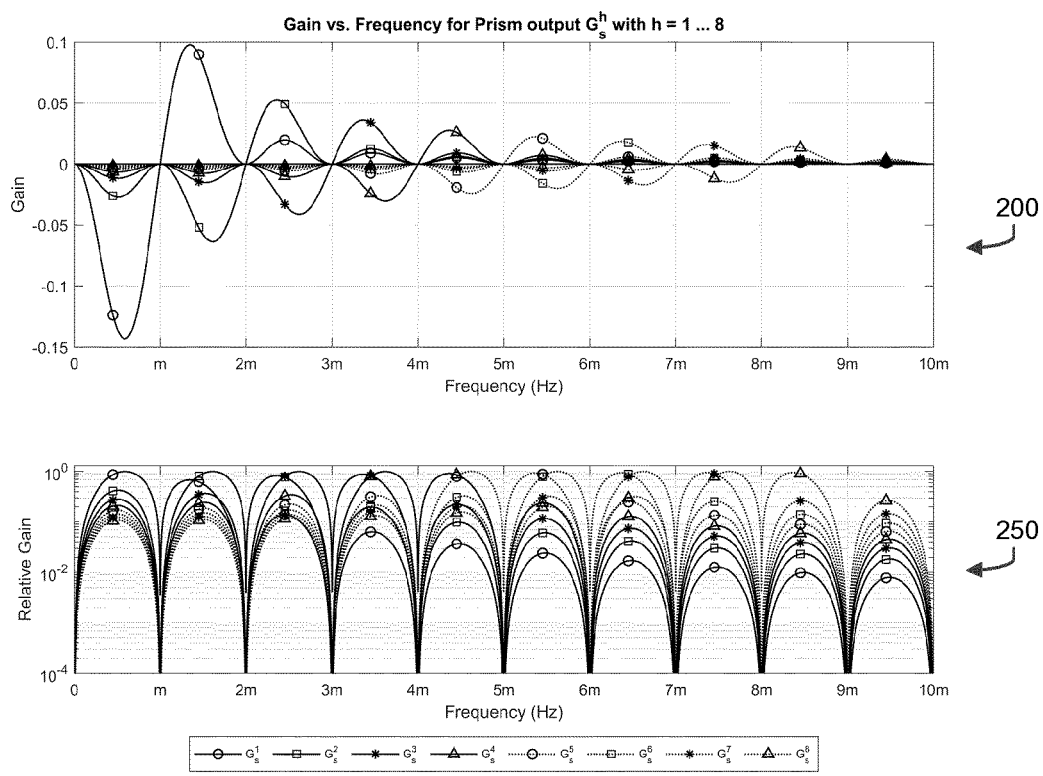
FIG. 2 is an exemplary graph showing gains of Prism output $G_s^h$ for selected values of h.

FIG. 2 shows how the gain of $G_s^h$ varies with frequency (relative to m) and h. As illustrated, the peak negative value occurs just below h*m Hz and the peak positive value occurs just above this frequency value.

Figure 3:
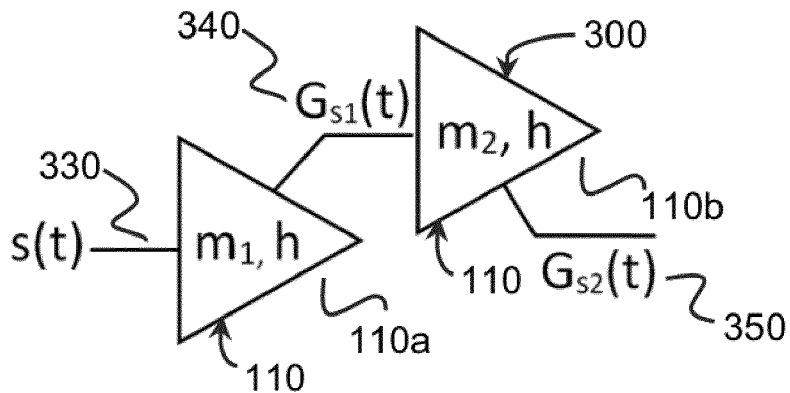
FIG. 3 is an exemplary graph showing a pair of Prisms in sequence, forming one stage of a bandpass filter.

FIG. 3 illustrates the first step towards constructing a bandpass filter. It shows a pair of Prisms 300 having a common value of h but with different values of m, selected so that peak negative and positive values of $G_s^h$ align for the two values of m. By concatenating Prisms in pairs as illustrated, bandpass filter can be formed in this embodiment as follows:

Both Prisms 110a and 110b provide a single $G_s$ output 340 and 350, respectively.

The signal to be filtered is the input 330 to the first Prism 110a; its output 340 (labelled $G_{s1}$) forms the input to the second Prism 110b. The output 350 of the second Prism 110b (labelled $G_{s2}$) forms the final output 350 of this filter stage 300.

Both Prisms 110a and 110b share a common harmonic number h but use different characteristic frequencies, here labelled $m_1$ and $m_2$.

Figure 4:
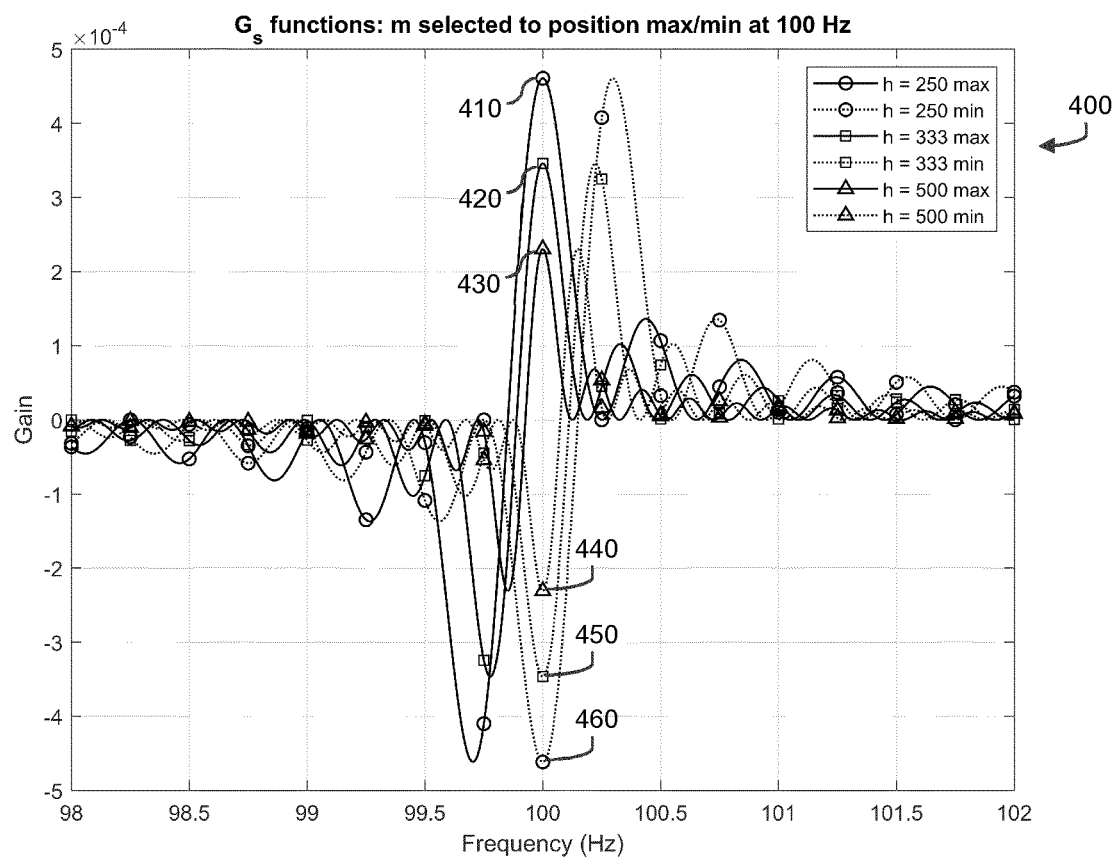
FIG. 4 is an exemplary graph showing $G_s^h$ functions designed for maxima or minima occurring at 100 Hz.

FIG. 4 shows the outputs of an embodiment of three such Prism pairs. Three h values are used: 250, 333, and 500, respectively. Higher h values result in a narrower high gain region (e.g., passband), which in each case here occurs within ±0.5 Hz of the central frequency. For each h value, two curves are plotted, where the m, values are selected so that either the maximum or the minimum value of the corresponding frequency response occurs at 100 Hz.

In certain embodiments, an obstacle to overcome in creating efficient Prism-based bandpass filters is the presence of large side-lobes. A lobe can be defined as any region between notches (i.e. zero values) in the frequency response. An ideal bandpass filter may comprise simply of a single lobe around the central frequency. Each $G_s$ function, however, can have two relatively high-gain lobes (one positive and one negative) centred on h*m Hz, as well as many other lower-gain lobes. The arrangement in FIG. 4 both illustrates this problem and suggests a solution. FIG. 4 comprises frequency-response curves with maxima or minima occurring at 100 Hz. In the plot, all the curves 410-430 with a positive peak at 100 Hz have another peak of similar magnitude at a lower frequency. All the curves 440-460 with a negative peak at 100 Hz have another peak of similar magnitude at a higher frequency. But a combination of each pair (e.g., using the concatenation of two Prisms shown in FIG. 3) may be used to create more symmetric bandpass filters, each with a dominant central lobe.

Figure 5:
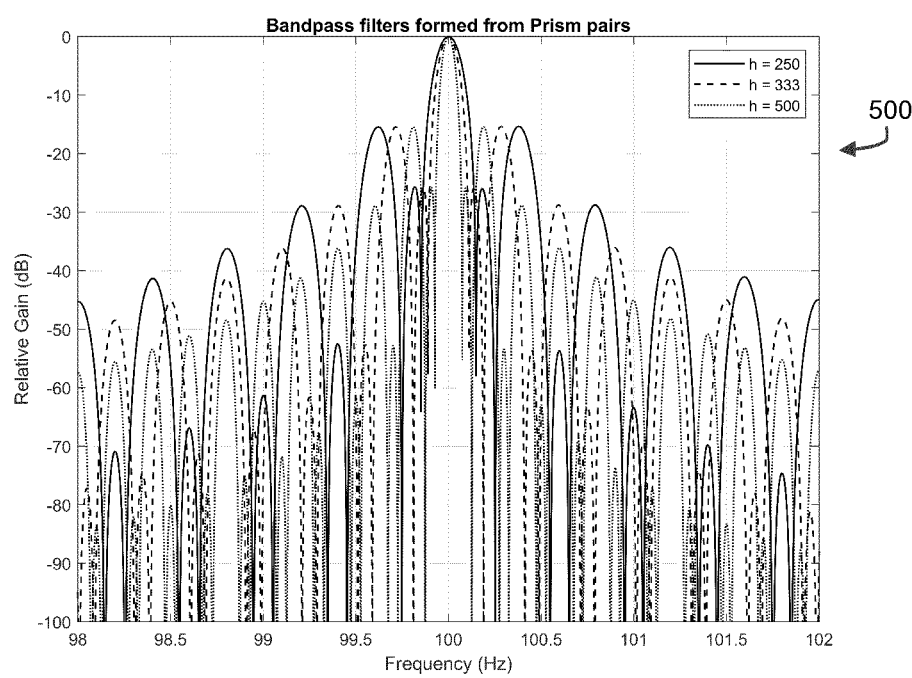
FIG. 5 is an exemplary graph showing bandpass filter responses utilizing $G_s^h$ functions in FIG. 4.

FIG. 5 shows the result of combining each pair of frequency-response curves with the same h value, for the embodiment shown in FIG. 4. As illustrated, the y axis shows the gain in decibels relative to the absolute peak value. As shown, each Prism-pair filter in this embodiment has a peak at the desired central frequency and a reasonably symmetric and declining gain with increasing distance from the peak at 100 Hz.

Figure 6A:
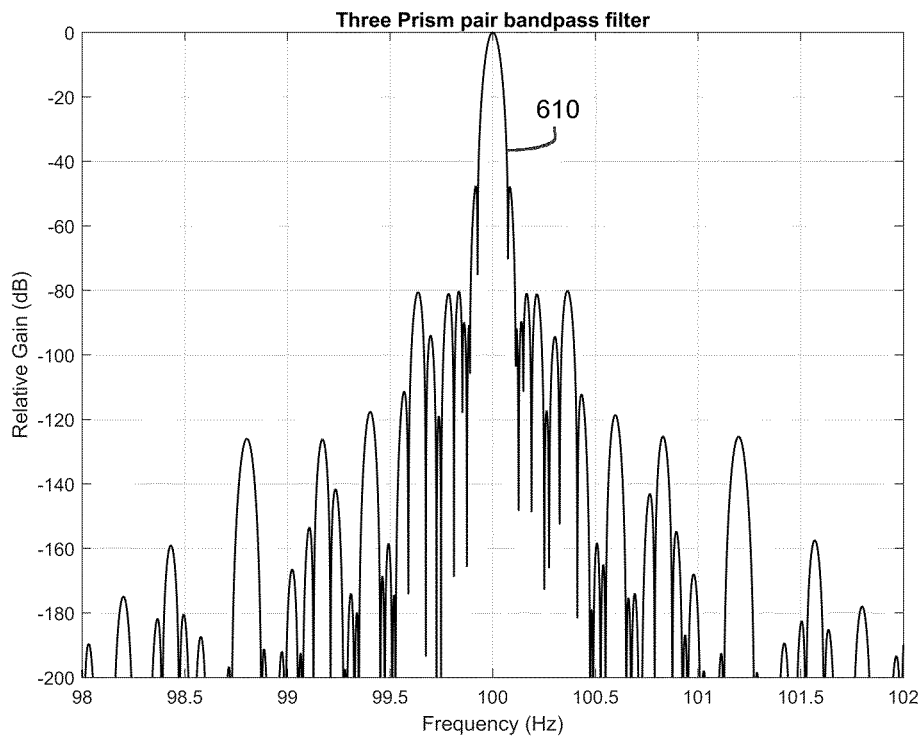
FIG. 6A is an exemplary graph showing frequency response of bandpass filter formed from three Prism pairs.
Figure 6B:
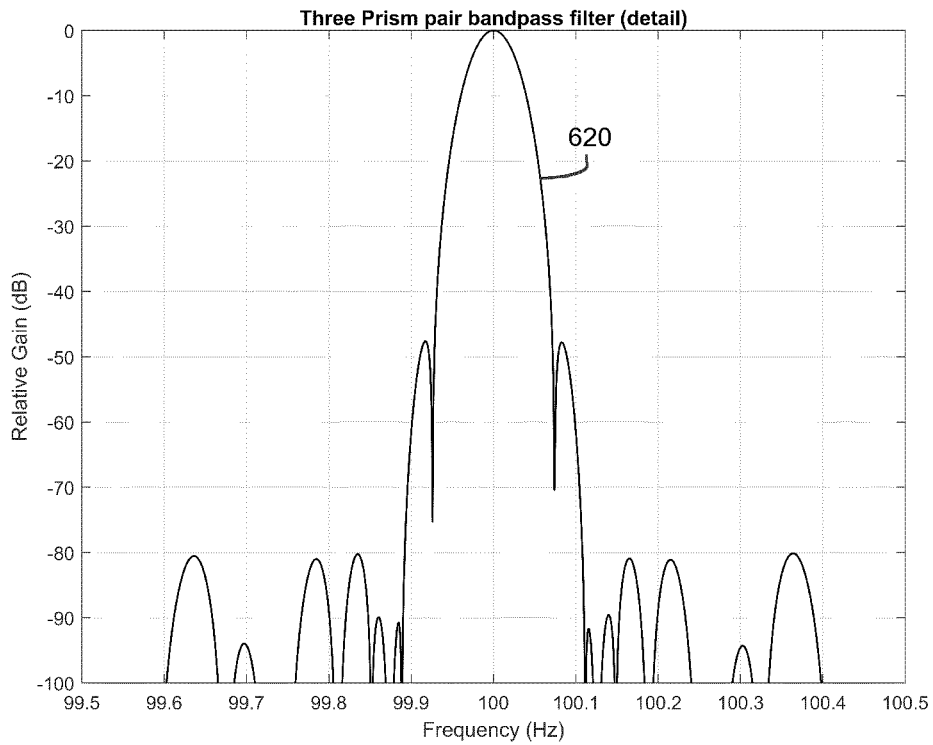
FIG. 6B is an exemplary graph showing a close-up view of FIG. 6A.

FIGS. 6A and 6B (close-up) show the results of combining all 3 filters in this embodiment together, e.g., through a concatenation of six Prisms in series, and where the resulting gain is the product of the gains of each individual Prism. As shown, the resulting frequency response 610, 620 has a rapid decline in gain with distance from the central frequency. The selected ratio of the three h values results in effective cancellation of side lobes. No frequency outside the range 100 Hz±0.1 Hz has a relative gain of more than −70 dB. Indeed, the maximum relative gain decreases rapidly to −80 dB in the range 100 Hz±0.5 Hz (outside the range 100 Hz±0.1 Hz), and to just slightly over −120 dB beyond that range.

This embodiment of filter structure, comprising three pairs of Prisms, with similar ratios between the three h values, can be preferred embodiment used for this disclosure. Alternative filter structures, with different numbers of Prisms (singles or pairs), or different ratios between h values, can be used to achieve different bandpass performances, with corresponding trade-offs in terms of the computational resources required.

This embodiment of filter structure can be generalized as follows. Assume the desired filter has central frequency c, and bandwidth (defined below) b. Simple yet powerful formulae can be used to provide the corresponding values of m and h for each of the six Prisms to meet this performance requirement. As stated above, once the values of m and h are determined, the subsequent design of each individual Prism can be readily achieved.

Figure 7:
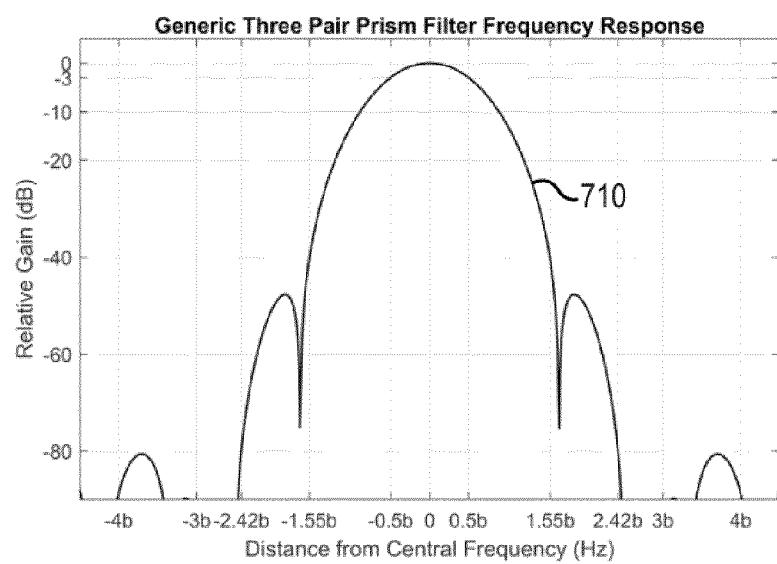
FIG. 7 is an exemplary graph showing a generic frequency response of bandpass filter formed from three Prism pairs.

FIG. 7 shows the frequency response 710 of the generalized three-pair-Prism filter with arbitrary central frequency c and bandwidth b. The bandwidth can be defined such that the relative gain in the region [−b/2, +b/2] remains within the range from −3 to 0 dB, e.g., the region of length b Hz, centred on c Hz, has a relative gain of more than −3 dB. Given this definition of b, other characteristics of the filter can be determined, as follows:

The gain drops to −40 dB at ±1.55 b Hz

The gain drops to −80 dB at ±2.42 b Hz

These constitute the specific characteristics of this embodiment of filter template. Other filter designs, for example using more Prisms, may result in more rapid drops in gain at the expense of additional computational load and/or higher memory requirements.

Given desired values of c and b, the corresponding values of m and h for each Prism can be calculated as follows. First, the three values of h are calculated, in the approximate ratio 6:4:3, (e.g., 500:333:250) while allowing only integer values of h. The desired values can be found using:

$$h\_vals = \text{round}(0.0371 \times c/b \times [6,4,3]) \quad (18)$$

where round is the integer rounding function and 0.0371 is a scaling constant to achieve −3 dB gain at ±b Hz. For example, if c=1000 Hz and b=1 Hz, the desired h values are 223, 148, and 111.

For sufficiently large h (e.g., h>20), it can be observed that the peak positive and negative values of the corresponding frequency response function $G_s^h$ occur at approximately m×(h+0.371) and m×(h−0.371), respectively. Accordingly, to make these peak values correspond to the central frequency c, the two values of m for each value of h can be determined by:

$$m_1 = c/(h+0.371)$$

$$m_2 = c/(h-0.371) \quad (19)$$

Using equations (18) and (19), the values of h and m can be calculated for each of the six Prisms in this filter embodiment. Continuing the example of c=1000 Hz and b=1 Hz, for instance, the corresponding desired values of m are as follows:

For h=223, $m_1$=4.4768 Hz, $m_2$=4.4917 Hz.

For h=148, $m_1$=6.7398 Hz, $m_2$=6.7737 Hz.

For h=111, $m_1$=8.9789 Hz, $m_2$=9.0392 Hz.

In some applications, the values of m may be constrained by a requirement that each Prism integral length must be a whole number of samples; this may lead to small variations in the realised values of m with corresponding minor variations in the actual frequency response of the filter. Slightly more stringent requirements may be needed for the requirements of Romberg Integration. Improved precision in the Prism outputs may be achieved if the integration calculation performed in each block uses Romberg Integration. This may, however, lead to additional constraints on the length of each integral in samples, as discussed above.

Continuing with the same example, assuming a sample rate fs of 1 MHz, then the total length of the filter is 1,928,000 samples. As an approximate rule, the filter length can be computed as 1.93×fs/b.

Figure 8A:
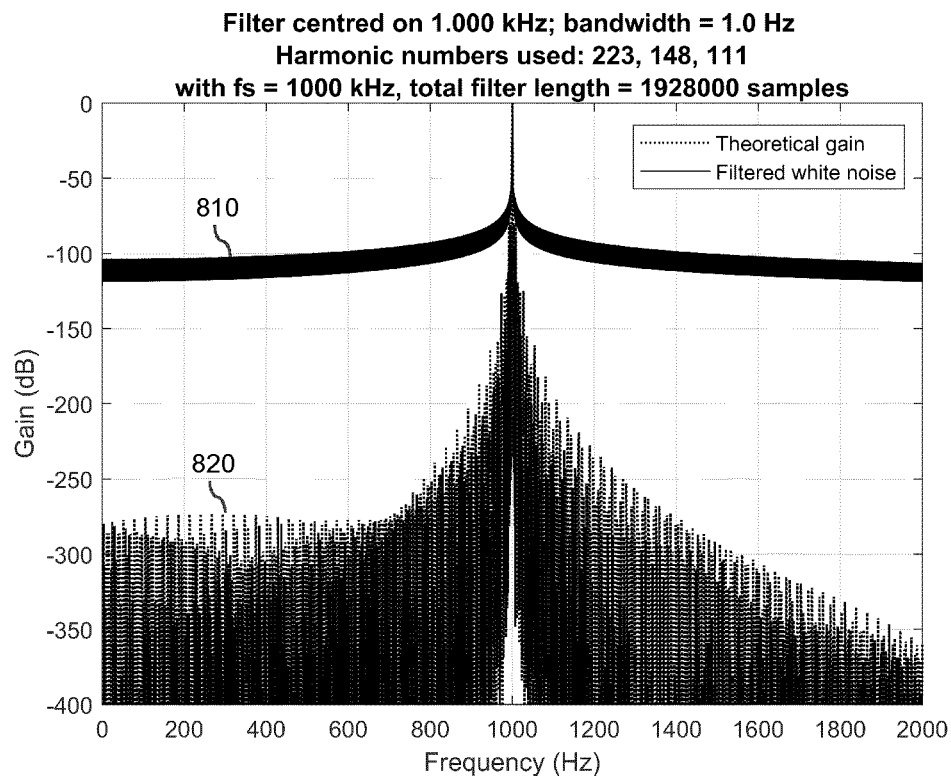
FIG. 8A is an exemplary graph showing the theoretical and numerical performance of bandpass filter for a first particular filter specification.
Figure 8B:
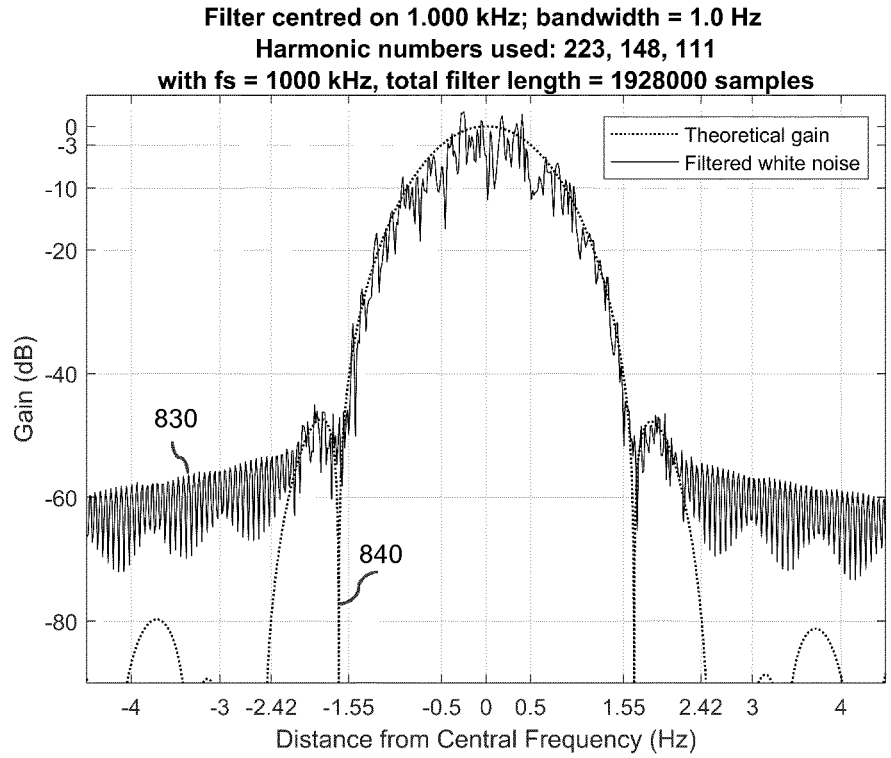
FIG. 8B is an exemplary graph showing a close-up view of FIG. 8A.

FIGS. 8A and 8B (close-up) show the comparison of the theoretical response 820, 840 of the above filter embodiment with its simulated performance 810, 830 based on filtering white noise, using the power spectrum obtained using 100 seconds of data (or 100 million samples at fs=1 MHz). The simulated performance 810, 830 is calculated based on the filtering 100 million samples of white noise and applying a Fast Fourier Transform (FFT) calculation to the filtered output. Accordingly, the generally higher noise floor of the actual filtering performance compared with the theoretical value 820, 840 in FIG. 8 may be in part due to numerical precision limitations in the FFT calculation. The numerical performance around the passband, however, shows a good correspondence with the theoretical frequency response.

This embodiment of the filter was implemented using a single threaded C++ function and executed on a desktop PC. Embodiments of Prism-Based Bandpass Filters Several exemplary embodiments below demonstrate the generality of the design procedure given in the preceding section. It is demonstrated that very narrow filters can be constructed using the exemplary generic procedure, with the following advantages over conventional FIR filters:

The filter design procedure, as stated above, is simple, whereas conventional FIR filter design is complex, particularly for long filters.

The computational burden is fixed, irrespective of the length of the filter, whereas with conventional FIR filters the computational burden increases linearly with filter length.

Accordingly, Prism signal processing can make available, using only modest resources, a level of filtering performance that previously might only have been possible using supercomputing facilities. A primary constraint in implementing very narrowband Prism filters may be available memory, as discussed below. In the examples below, double-precision calculation is used.

Figure 10:
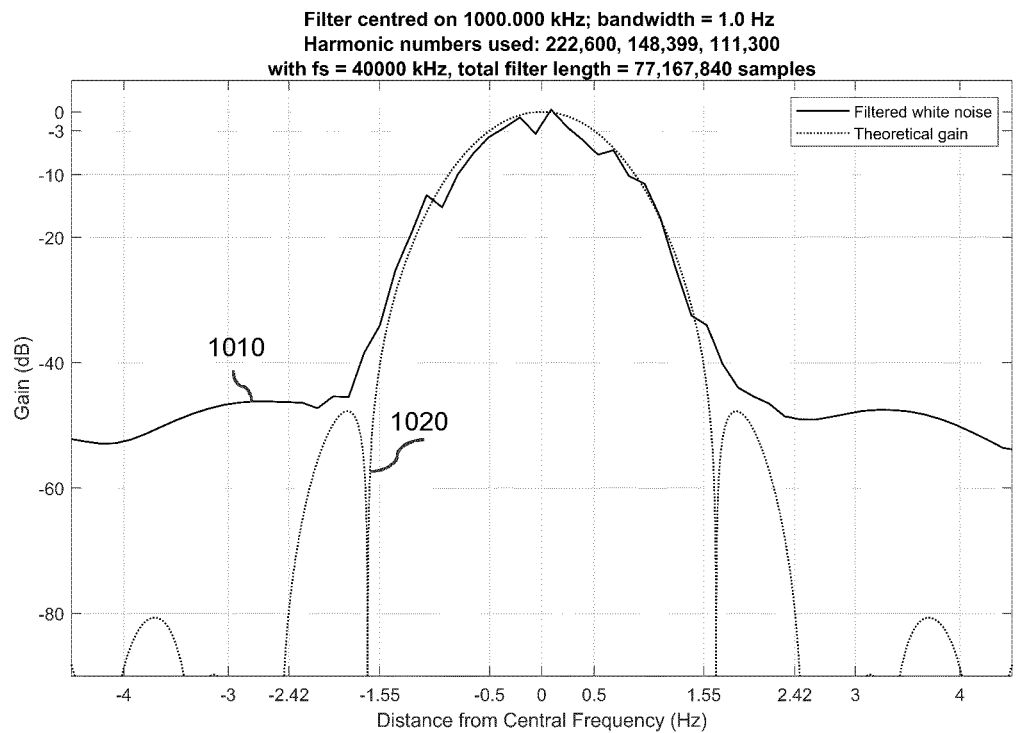
FIG. 10 is an exemplary graph showing the theoretical and numerical performance of bandpass filter for a third particular filter specification.
Figure 11A:
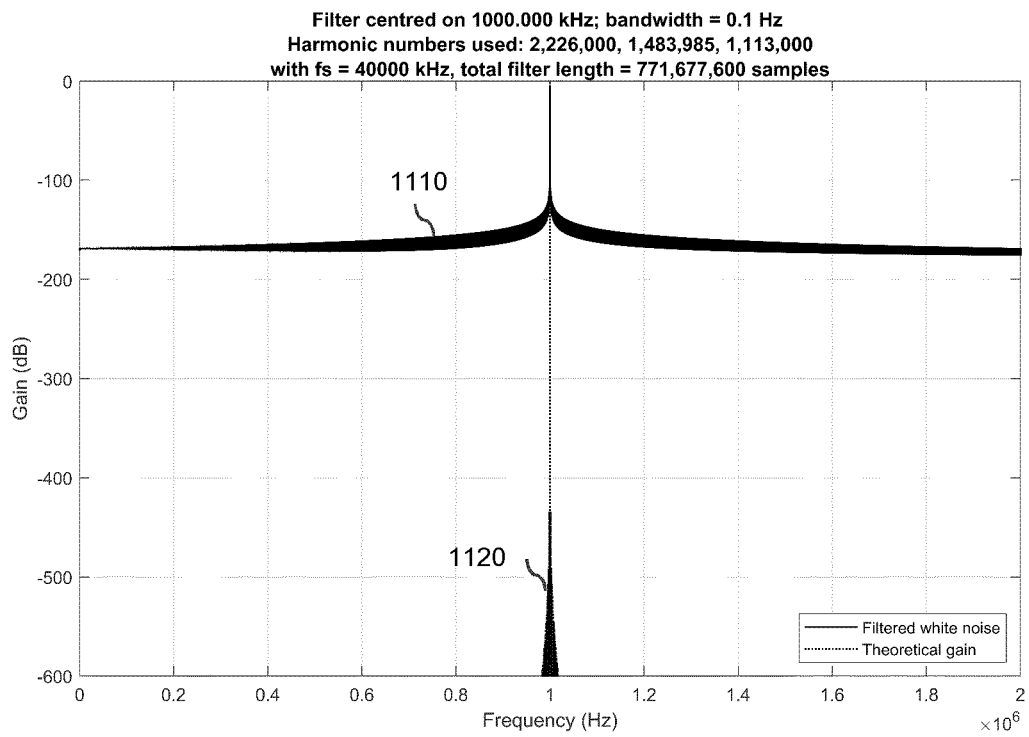
FIG. 11A is an exemplary graph showing the theoretical and numerical performance of bandpass filter for a fourth particular filter specification.
Figure 11B:
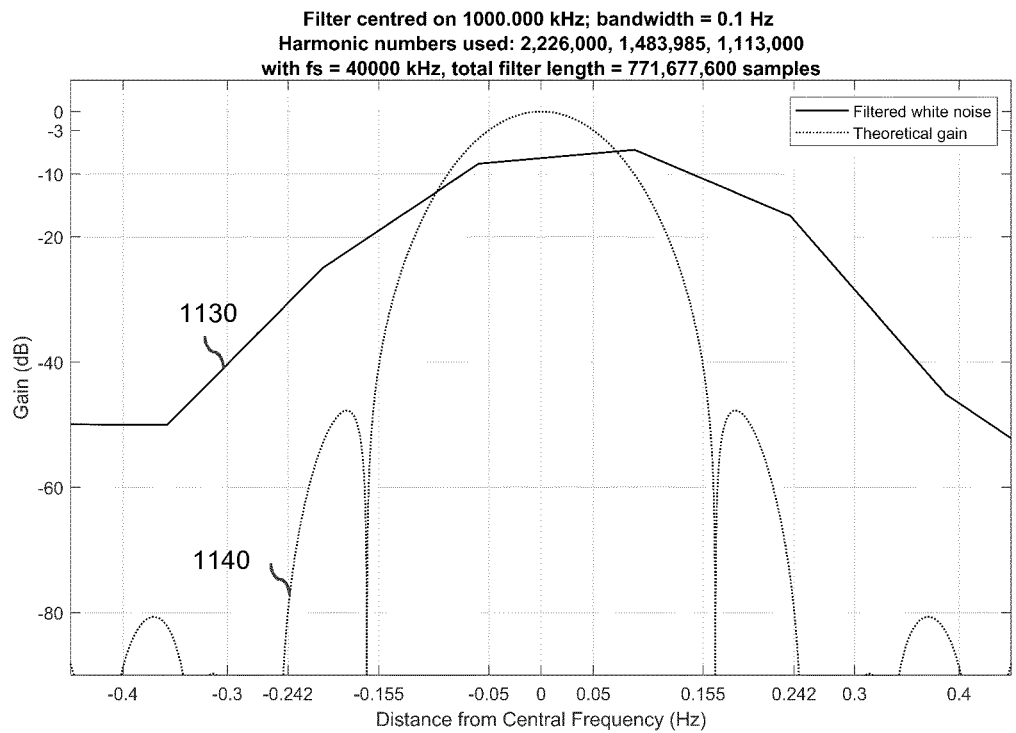
FIG. 11B is an exemplary graph showing a close-up view of FIG. 11A.

For the first three examples below, the sample rate fs is constant at 40 MHz and the central frequency c is 1 MHz, but the bandwidth is reduced from 10 Hz (FIG. 9) to 1 Hz (FIG. 10) to 0.1 Hz (FIGS. 11A and 11B). These embodiments illustrate the relationship between the bandwidth b, the harmonic number h, and the resulting filter length.

Figure 9:
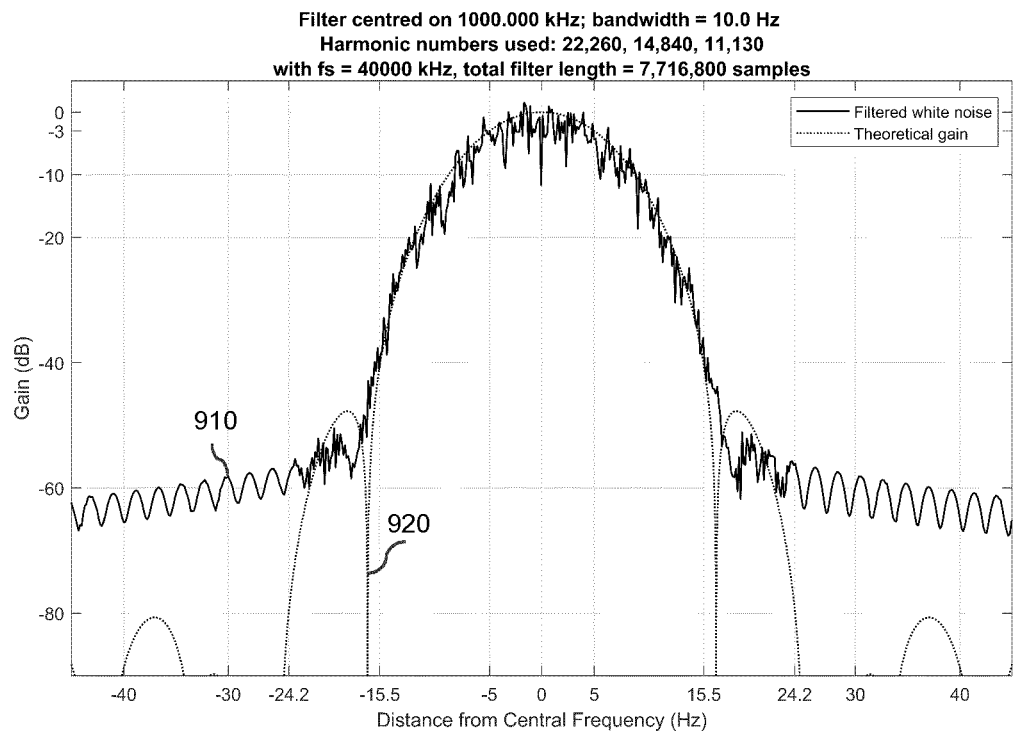
FIG. 9 is an exemplary graph showing the theoretical and numerical performance of bandpass filter for a second particular filter specification.

In FIG. 9, the values of h are 22,260; 14,840; and 11,130; the total filter length is 7,716,800 samples. The numerical implementation 910 of the filter shows a good match with the theoretical frequency response 920. In FIGS. 10 and 11A-11B, as the filter bandwidth is reduced by an order of magnitude each time, the corresponding values of h and the total filter length in samples both increase by approximately tenfold. Specifically, in FIG. 10, the values of h are 222,600; 148,399; and 111,300; the total filter length is 77,167,840 samples. In FIGS. 11A and 11B, the values of h are U.S. Pat. Nos. 2,226,000; 1,483,985; and 1,113,000; the total filter length is 771,677,600 samples. As the passband frequency decreases, the frequency discretization of the FFT used to analyze the numerical results can become more apparent, resulting in the theoretical 1140 and numerical 1130 gains not closely matching each other in FIG. 11B. Examples in the next section provide alternative means of verifying that the filters are performing as expected. These examples demonstrate that the simple but powerful formulae given above can be used to generate the desired bandwidth.

Figure 12:
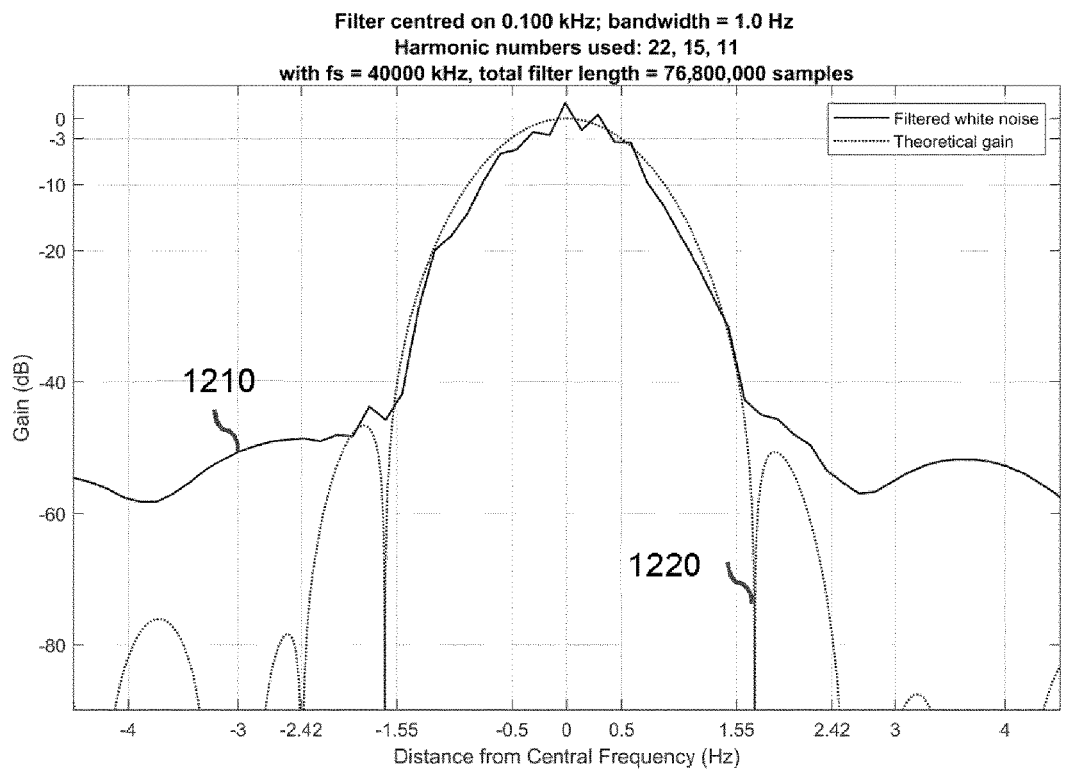
FIG. 12 is an exemplary graph showing the theoretical and numerical performance of bandpass filter for a fifth particular filter specification.

FIG. 12 shows another filter embodiment with the same fs but a lower central frequency, with c=100 Hz and b=1 Hz. The resulting performance 1210, 1220 is broadly similar to that shown in FIG. 10, demonstrating independence from the selection of c. In other words, FIG. 12 demonstrates that the same design technique works at low frequencies. In this embodiment, the same sampling rate is used, but the central frequency is set at only 100 Hz and the bandwidth is 1 Hz. Thus the simple but powerful design procedure can be used over a broad range of Prism-based filter designs.

In the exemplary embodiments, the memory required to implement a Prism-based bandpass filter is proportional to the filter length. The compute time per sample, however, is constant for a particular processor. The embodiments shown in FIGS. 8-12 all require approximately 0.39 μs per sample, using C++ single-threaded calculation on an Intel Xeon $E_5$-2630 processor running at 2.3 GHz and with 32 Gb RAM. In contrast, the evaluation of a conventional, non-recursive, 771 million sample FIR filter in 0.39 μs would require a computational load (based on 2×filter length/computer time per sample) of 3.9 Petaflop/s. This load is equivalent to the 28th fastest supercomputer, see Top500 List, https://www.top500.org/list/2017/11/?page=1, accessed Apr. 11, 2018, which uses 126,468 Xenon $E_5$-2695 chips running at 2.1 GHz. This contrast illustrates the high computational efficiency provided by Prism signal processing.

An Embodiment of Prism-Based Bandpass-Filter-and-Tracker

Bandpass filters may be used to provide effective pre-filtering for a Prism-based tracker, for example a Recursive Signal Tracker (RST). See supra "Fast Coriolis mass flow metering for monitoring diesel fuel injection." RST can be used to calculate frequency, amplitude and/or phase estimates of an input sinusoid. Prism-based bandpass pre-filtering can facilitate the tracking of signal components which otherwise may not be possible, due to high levels of noise and/or the presence of other frequency components.

Figure 13:
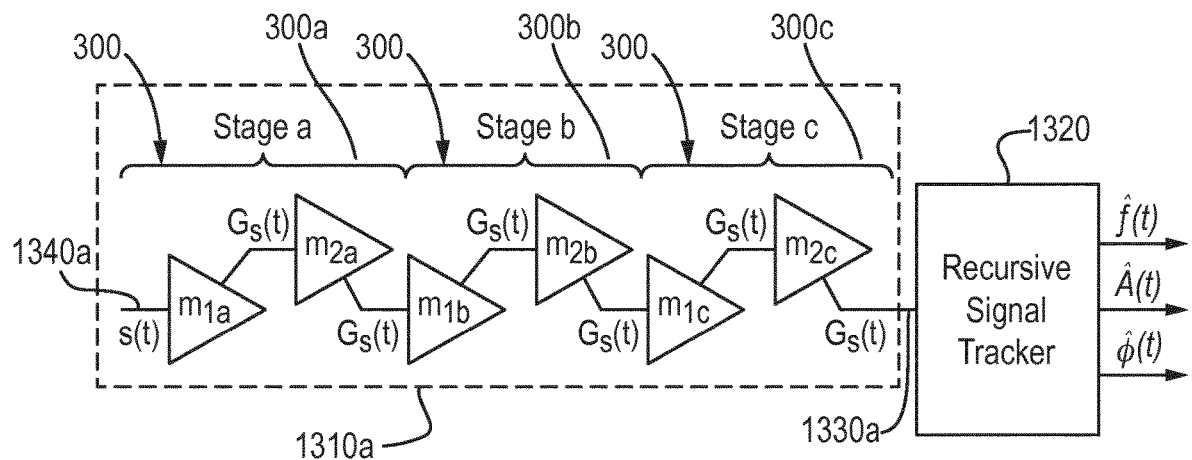
FIG. 13 is an exemplary graph showing structure of bandpass filter and tracker.

FIG. 13 illustrates an embodiment of bandpass filter 1310a and tracker 1320—a three-stage bandpass filter 1310a receives an input 1340a and passes its output 1330a to an RST 1320, which can track the sinusoidal parameters of the filter output 1330a. Although shown and described as comprising three Prism pairs 300a, 300b, and 300c in this preferred embodiment, the bandpass filter can include any predetermined number of Prism pairs 300 as stated above.

FIGS. 14-19 show the tracking performance achieved in the following embodiment using simulation. A sinusoid with frequency 100 kHz and amplitude 1 mV is mixed with high amplitude white noise (standard deviation 707 mV); the signal-to-noise ratio is −60 dB. The resulting noisy signal is sampled at 20 MHz, filtered and tracked. Because the input signal frequency is already known to high precision, the bandpass filter can be designed using c=100 kHz and b=0.1 Hz. The tracker uses m=200 kHz.

Figure 14:
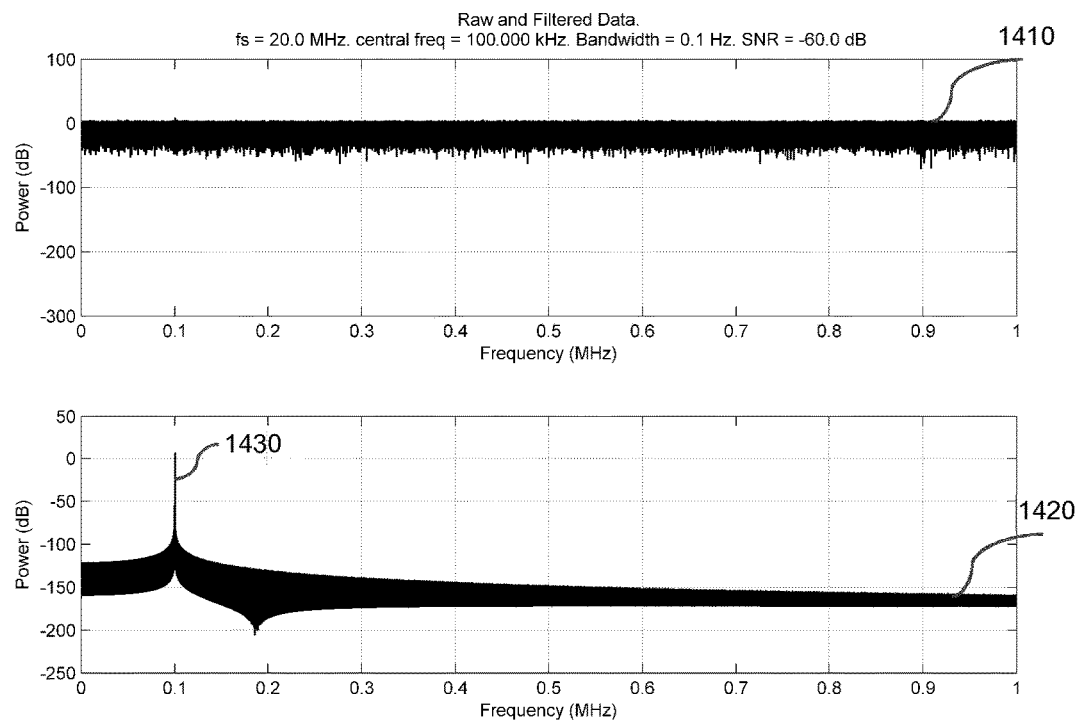
FIG. 14 is an exemplary graph showing power spectra associated with a filter-and-track embodiment.

FIG. 14 shows the power spectra of the raw and filtered (using the embodiment described above) signals respectively, up to 1 MHz. Given the high level of noise, the signal at 100 kHz is not visible in the power spectrum 1410. The Prism-filtered signal 1420, on the other hand, has a strong peak 1430 at 100 kHz.

Figure 15:
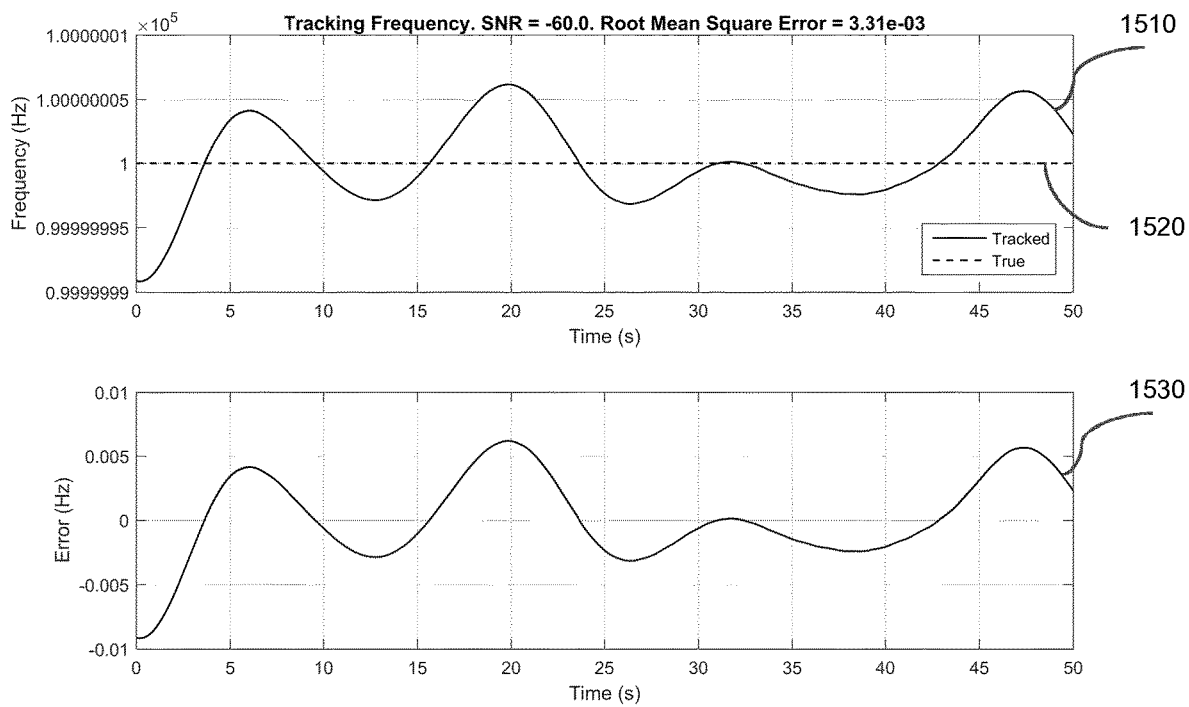
FIG. 15 is an exemplary graph showing the frequency-tracking performance of the filter-and-track embodiment in FIG. 14.
Figure 16:
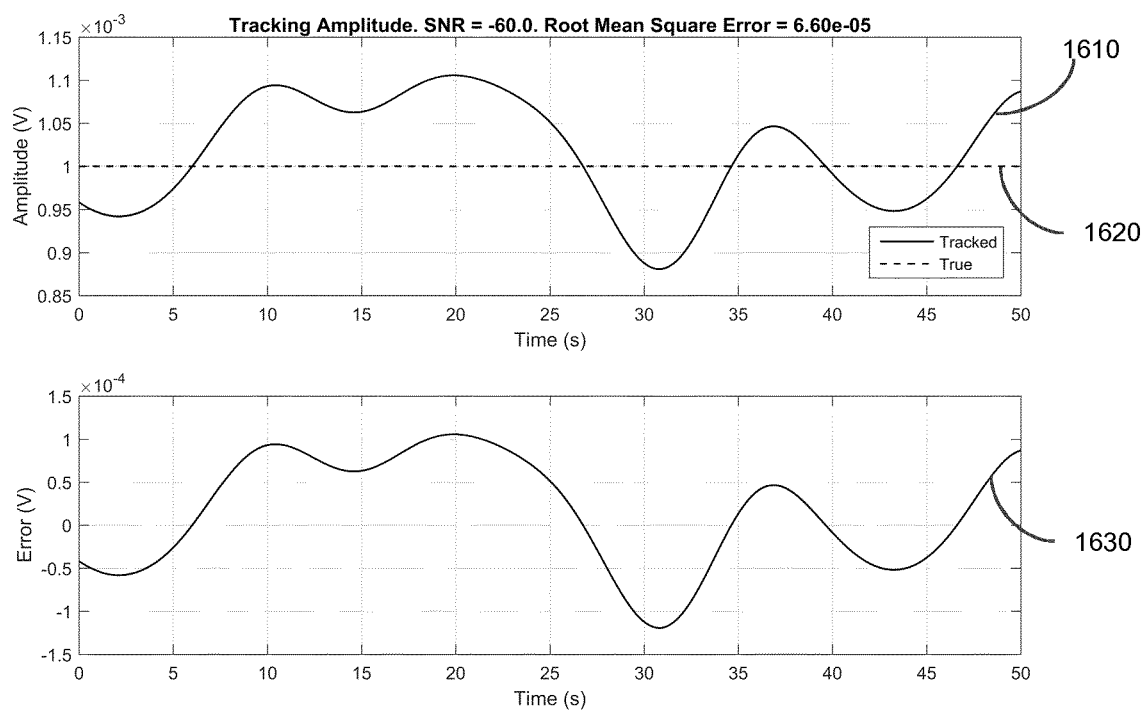
FIG. 16 is an exemplary graph showing the amplitude-tracking performance of the filter-and-track embodiment in FIG. 14.
Figure 17:
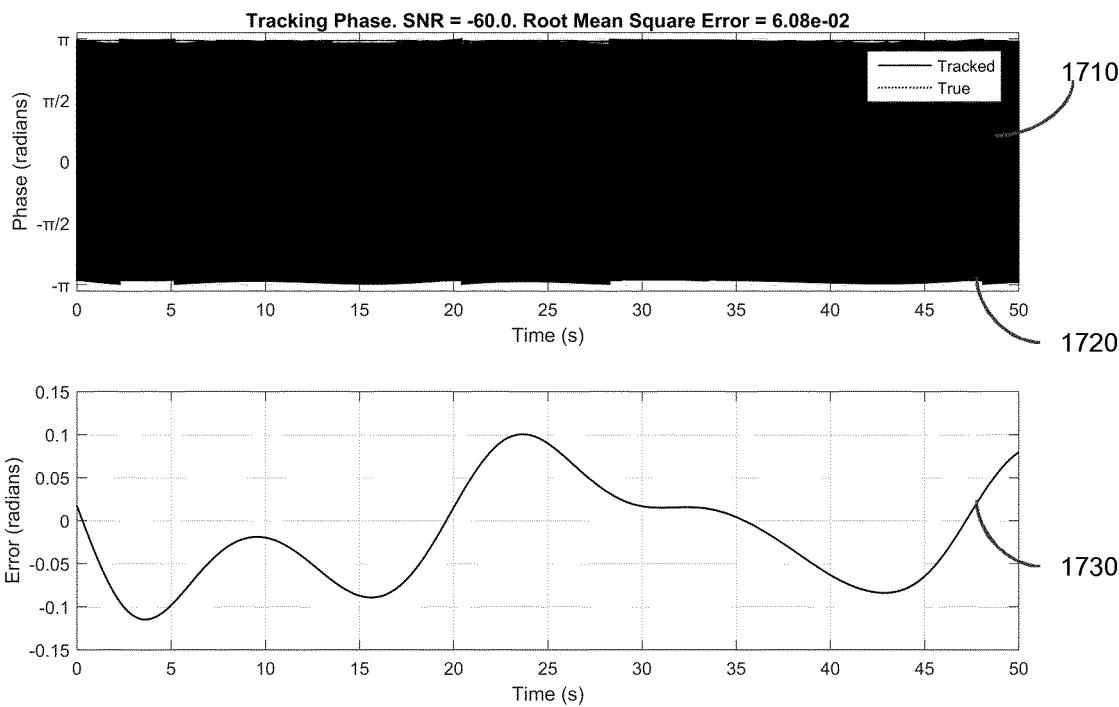
FIG. 17 is an exemplary graph showing the phase-tracking performance of the filter-and-track embodiment in FIG. 14.
Figure 18:
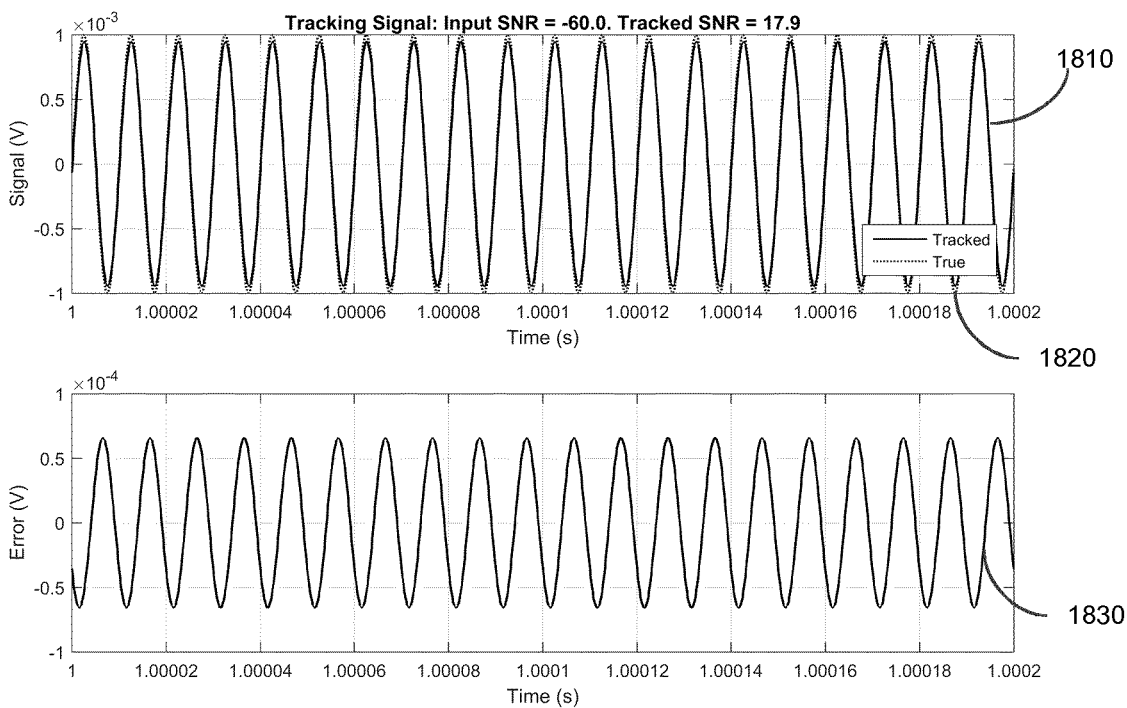
FIG. 18 is an exemplary graph showing the recovered signal from the filter-and-track embodiment in FIG. 14.

FIGS. 15-18 show the tracked frequency 1510, amplitude 1610, phase 1710, and the recovered signal 1810, respectively, using the embodiment described above. In each figure, the tracked parameter (1510, 1610, 1710, or 1810) and its true value (1520, 1620, 1720, or 1820) are shown in the upper plot, while the residual error (1530, 1630, 1730, or 1830) is shown in the lower plot. In FIG. 15, the true frequency 1520 is constant at 100 kHz; this value is tracked with a root mean square error of approximately 1e-3 Hz. In FIG. 16, the true amplitude 1620 is constant at 1 mV; this value is tracked with a root mean square error of 0.066 mV. In FIG. 17, the true phase 1720 varies between +/−π radians; this value is tracked with a root mean square error of 0.06 radians. In FIG. 18, the recovered signal 1810 (constructed from the tracked amplitude and phase) is compared with the original 1820. The root mean square error is approximately 0.1 mV, resulting in an overall change in SNR from −60 dB to +17.9 dB as a result of the filter-and-track procedure. The amplitude and phase parameters of the tracked signal can be compensated for the pre-filtering, as they are in the embodiment shown, to enable the reconstruction of the original signal.

As demonstrated, using Prism-based filtering, this filtering-and-tracking performance can be straightforward to design and implement despite the very low signal-to-noise ratio. In the example above, the central frequency is assumed known at the outset, and there are many applications where this is the case. For example, where specific frequencies are characteristic of chemical components to be traced in a spectroscopy signal, or where a specific frequency is to be tracked in a communication signal. In other circumstances, the frequency to be tracked may be known only to fall within a specific range. Once located, more and more narrow bandpass filters may be constructed (in real-time if desired, made possible by the straightforward design) around the discovered frequency to improve the accuracy with which it is tracked.

One observed feature of FIGS. 15-17 is the relatively slow dynamic response, e.g., the frequency, amplitude, and tracking errors in frequency, amplitude, and phase, all change relatively slowly. This results from the tradeoff between filter bandwidth and dynamic response. Even though the sample rate is 20 MHz, and the signal frequency is 100 kHz, changes occur at a rate determined by the filter bandwidth, which is 0.1 Hz.

Figure 19:
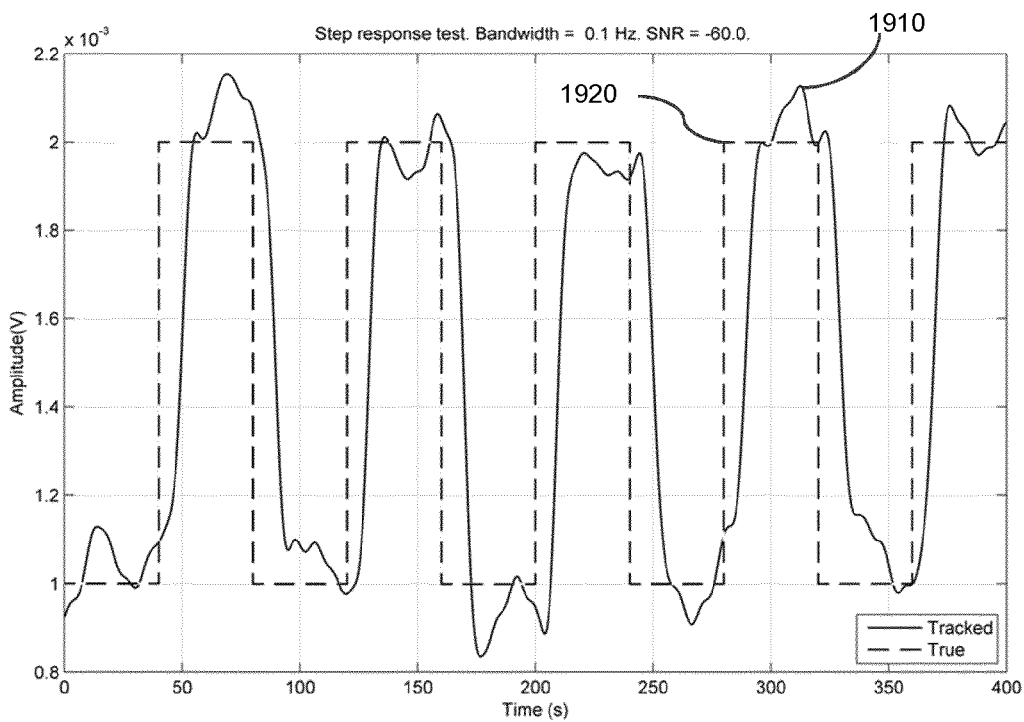
FIG. 19 is an exemplary graph showing another filter-and-track embodiment.

FIG. 19 shows another filter-and-track exemplary embodiment. This embodiment can demonstrate the dynamic response of the system. The sample rate is 20 MHz, the central frequency c is 250 kHz, the bandwidth b is 0.1 Hz, and the signal to noise ratio is −60 dB. The true signal amplitude 1920 undergoes a series of step changes between 1 mV and 2 mV; this pattern can be effectively and essentially recovered by the filter-and-track mechanism, producing tracked signal amplitude 1910. This embodiment demonstrates the potential of this technique to recover digital data (i.e. a bit stream) in a noisy signal.

Figure 20:
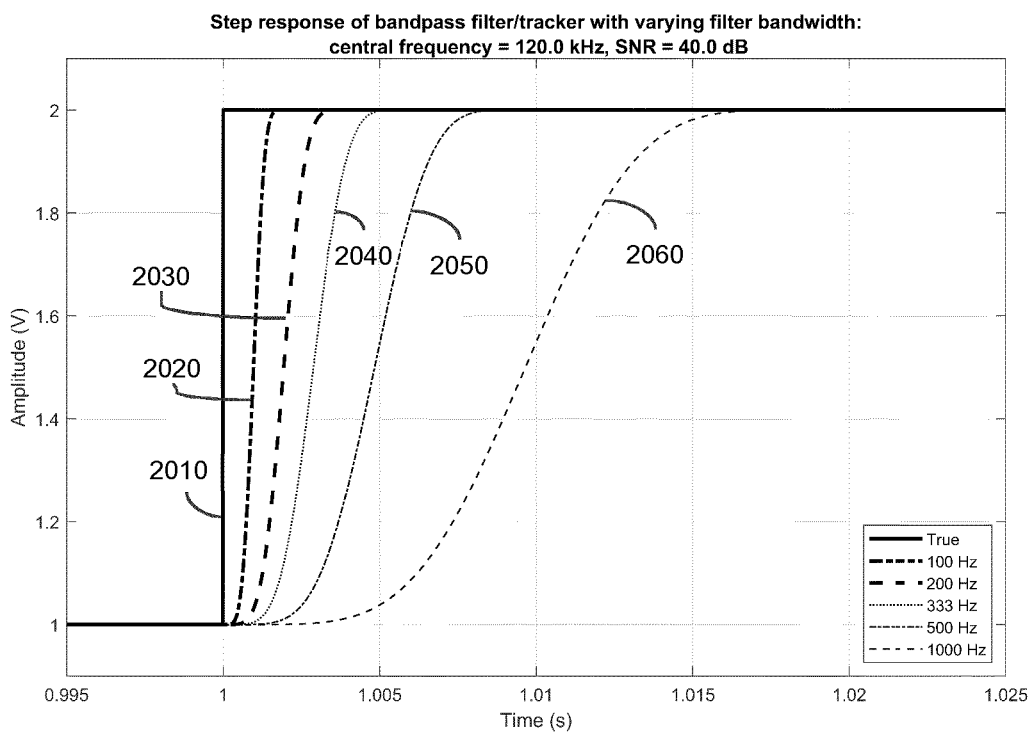
FIG. 20 is an exemplary graph showing response time versus bandwidth to a step function.

This tradeoff between filter bandwidth and dynamic response can be more clearly demonstrated in FIG. 20, which shows the step responses of a range of bandpass filter-and-tracker embodiments using simulated data. In each case at t=1 s the true signal amplitude 2010 increases instantly from 1V to 2V. In each case the sample rate is 10 MHz, the central frequency is 120 kHz, and the signal-to-noise ratio of the input signal is 40 dB. As expected, the step response 2020-2060 of each filter-and-tracker embodiment is a function of the bandwidth of the filter. For bandwidth b, the step change can be complete within a period of approximately 2/b seconds, so that a more narrow bandpass filter provides better noise reduction at the expense of a slower dynamic response.

Accordingly, using Prism-based bandpass filters, the filtering-and-tracking scheme becomes straightforward to design and implement and can deliver useful results even with low SNR inputs. This type of design requires knowledge of the frequency range (e.g. the values of c and b) to be monitored, which may be determined at a local level in real time. These techniques offer a powerful toolset to autonomous devices to adapt signal-processing schemes to match changing local conditions and evolving goals.

The disclosure above has described a scheme for constructing Prism-based bandpass filters using simple but powerful design rules, which can be based on knowledge of the desired central frequency and bandwidth. The resulting filters share the computational efficiency of individual Prisms. Combining a bandpass filter with a Prism-based tracker can facilitate tracking of a signal component even with low SNR.

This disclosure shows method and system for:
the use of multiple values of h, in fixed ratios, to more effectively reduce the gain of side-lobes, creating sharper filter cutoffs in the frequency domain.

a simple but powerful design method to generate bandpass filters with arbitrary central frequency and passband given a preferred embodiment (comprising a set of h values)

This disclosed method and system has the following benefits:

Simple but powerful design of narrow band filters, where design decisions can be made in real time.

Ultra-narrow bandpass filters, where the passband is as low as 1 e-9× sampling rate. One limitation may be available memory size. The simulation embodiments used a 32-Gbyte-memory desktop computer, with no great emphasis on efficient memory use.

A fixed calculation time, irrespective of the length of the filter: a filter specification requiring supercomputer performance for conventional FIR filtering can be delivered using a conventional desktop/laptop.

The exemplary embodiments illustrate the suitability of the design scheme to create long filters, which would require supercomputing resources if calculated using the conventional non-recursive FIR convolution. The technique, however, is equally well-suited to shorter filter designs.

The disclosed method and system has many applications where conventional bandpass filtering is used, and where simplicity of design and speed of calculation would be advantageous, e.g., condition monitoring of rotating machinery, electrical power supply, vibration monitoring, resonant sensors. The disclosed method and system also has many applications where very narrow bandwidth filters would improve resolution, e.g. in optical, spectroscopic, and communications.

FPGA Embodiments of Prism-Based Ultra-Narrowband Filtering

The disclosed method and system is implemented in FPGA to demonstrate its computational efficiency and widespread applications.

An exemplary FPGA, Xilinx Artix-7 family of FPGAs, has a peak DSP performance of approximately 1 TMAC/s. A floating point Prism-based FIR bandpass filter can be instantiated on an Artix-7 with up to 192 million taps, updated at up to 2 MHz, and delivering an equivalent performance of up to 384 TMAC/s, while using only one third of the DSP resources on the FPGA. A PC host HMI facilitates the immediate creation of new filter implementations. Examples of experimental results are provided below.

The largest device in the Artix-7 FPGA family, the XC7A200T, has a nominal DSP performance of 929 GMAC/s (1 GMAC=$10^9$ MACs). Xilinx. 7 Series FPGAs Data Sheet Overview. DS180 (v2.6) Feb. 27, 2018. https://www.xilinx.com/support/documentation/data_sheets/ds180_7_Series_Overview.pdf. This performance calculation assumes all of the 740 DSP 'slices' in the FPGA operate in parallel to perform a new fixed-point MAC operation each clock cycle, with a 1.25 GHz clock. In practice such performance is not necessarily achieved for any specific application, due to unavoidable inefficiencies entailed in the details of the implementation.

The embodiments below demonstrate an FIR bandpass filtering application implemented on an Artix-7 that achieves the equivalent of up to 384 TMAC/s ($3.84 \times 10^{14}$ MAC/s), approximately 400 times faster than the nominal performance, and using floating point rather than fixed point arithmetic. The embodiments are not optimized, e.g., only approximately ⅓ of the DSP slices are used. Further performance improvements are possible.

The calculation is organized as a single bandpass filter, operating on analog-to-digital converter (ADC) data sampled at up to 2 MHz. The high MAC performance can be achieved via a high filter order (up to 192 million) using Prism Signal Processing as described above. Prism comprises a new type of FIR filtering that is fully recursive, e.g., the computational effort is independent of the filter length. The disclosed performance is based on equivalence, the computational load required to deliver a conventional non-recursive FIR filter of the same order and update rate.

Applying the Prism-based bandpass filter design technique above, a simple HMI on the host computer enables new bandpass filters to be designed and implemented on the FPGA instantly.

The exemplary implementation system comprises a PC hosting an Innovative Integration Inc XA-160M module (http://innovative-dsp.com/product/xa-160 m-two-160-msps-16-bit-adc-two-615-msps-16-bit-dac-artix-7-fpga/); this has dual 16-bit ADCs and DACs, an Artix-7 XC7A200T FPGA, and a 4 lane PCIe link to the host. For the purposes of generating the results disclosed below, inputs are provided by a dual channel signal generator, where typically one channel provides the sinusoidal signal to be tracked, and the second channel provides an interference signal, for example white noise or another sinusoid with an adjacent frequency. The host PC controls the bandpass filter design, filter operation, and data storage of experimental results.

Figure 21:
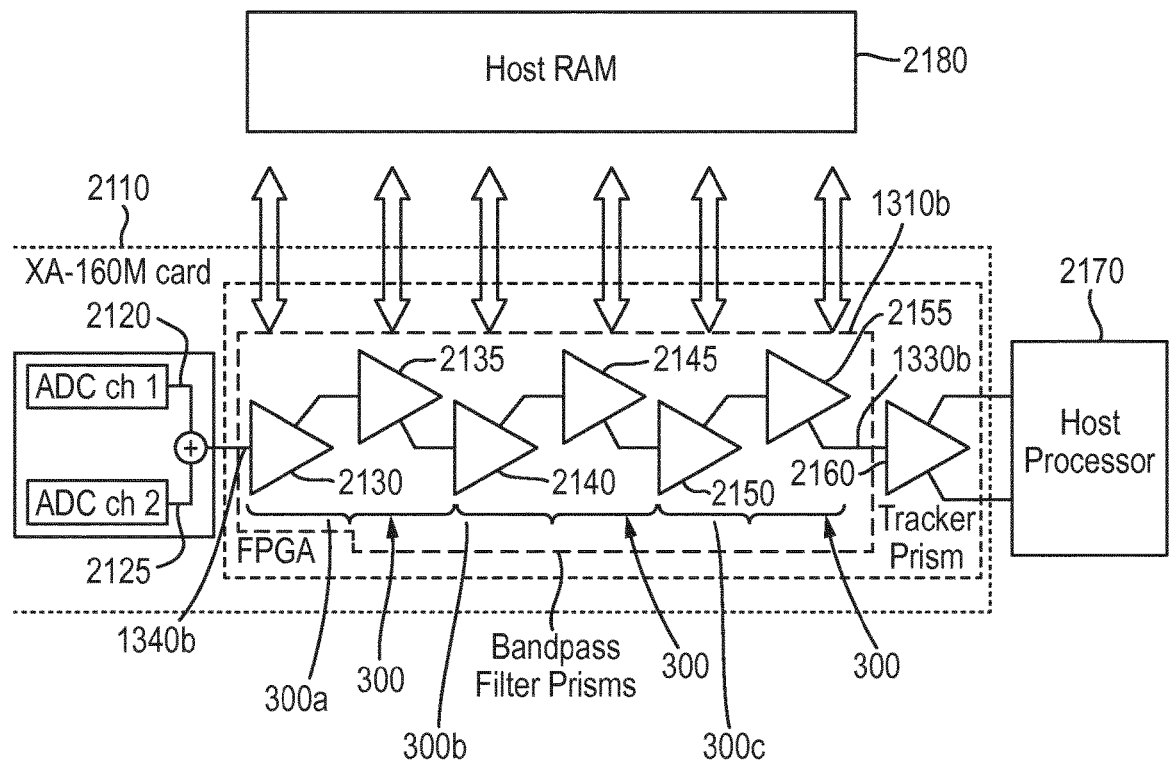
FIG. 21 shows an exemplary block diagram of an FPGA-based implementation of bandpass filtering.

FIG. 21 illustrates the arrangement. The XA-160M card 2110 can sample the two inputs separately (so they can be recorded individually) but then sums the digitized values 2120 and 2125 and feeds the sum as input 1340$b$ into the bandpass filter 1310$b$ comprising the six Prism filter 2130-2155, which form three Prism pairs 300$a$, 300$b$, 300$c$. The bandpass filter 1310$b$ outputs signal 1330$b$ into the tracker Prism 2160. Given a sampling rate fs and Prism parameter m, and defining l=fs/m, from FIG. 1 it can be deduced that approximately 8l storage locations may be required for each Prism, as follows: sine and cosine vectors of length l, and a shifting window of l product values for each of the six integration stages. In addition, a relatively small number of totalizers (registers), control variables etc., may be required. Viewed as a conventional FIR filter, however, the equivalent order of the Prism is only 2l (consider the concatenation of the two layers of integration blocks in FIG. 1). To achieve a balance between precision and execution speed in the exemplary FPGA embodiments, the sine/cosine and product vectors are stored as 32 bit floating point values, while the totalizers (registers) are 64 bit floating point values.

To facilitate the creation of long bandpass filters, the data needed for each filtering Prism is held in the 8 Gbyte RAM 2180 of the host PC including host processor 2170. This arrangement may be one of the limiting factors on total system data throughput (approximately 2M samples/s). The faster 1 Gbyte RAM on the XA-160M card is currently used for buffering for PCIe transfer; higher throughput, especially for smaller filters, may be possible with a different arrangement.

In FIG. 13, the tracker 1320 can be used to generate frequency, phase and amplitude values from the filter output. In the exemplary FPGA embodiment, the tracker functionality is split between the Prism 2160 and host PC including host processor 2170. As explained in "Fast Coriolis mass flow metering for monitoring diesel fuel injection," supra, the RST comprises a dual-output Prism (instantiated in the FPGA in the embodiment) and further calculations based on the Prism outputs. As the latter calculations include calls to trigonometric and square root functions, these are carried out on the host PC in the embodiment.

Prism algorithms previously coded in C++ were used as the basis for the FPGA coding in VHDL. The logic development tool Vivado™ includes a simulator enabling the VHDL code to be debugged by comparing outputs with the C++ code. Table 1 shows the exemplary Artix-7 resource usage for the FPGA design, which includes the 6+1 Prisms (the additional one for the dual-output Prism) and the interfaces to the ADCs, host, and host memory interfaces. Less than 30% of the DSP48 slices are used, leaving room for further improvements.

| Resource | Available | Utilization | |
|---|---|---|---|
| | | Quantity | % |
| LUT | 133800 | 59087 | 44.16 |
| LUTRAM | 46200 | 3169 | 6.86 |
| FF | 267600 | 102832 | 38.43 |
| BRAM | 365 | 144.50 | 39.59 |
| DSP | 740 | 218 | 29.46 |
| IO | 386 | 283 | 73.32 |
| GT | 8 | 8 | 00.00 |
| BUGF | 32 | 16 | 50.00 |
| MMCM | 10 | 4 | 40.00 |
| PLL | 10 | 1 | 10.00 |
| PCIe | 1 | 1 | 100.00 |

Figure 22:
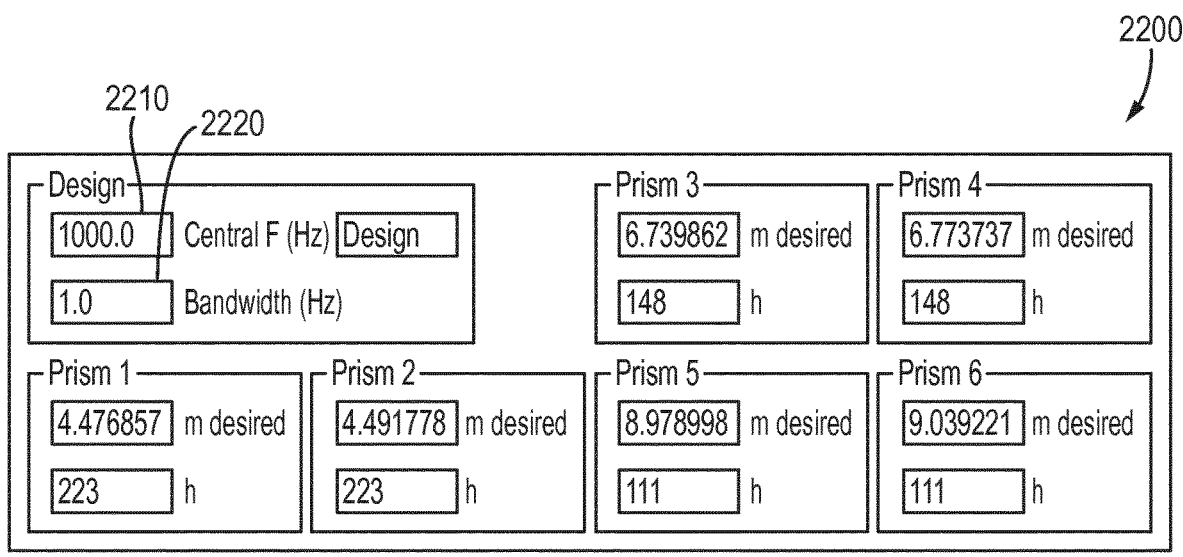
FIG. 22 shows an exemplary section of PC-host human-machine interface ("HMI") for an FPGA.

FIG. 22 shows a section of the PC HMI 2200. A new filter design can be created by supplying the desired central and bandpass frequencies 2210 and 2220. The corresponding values of m and h for each of the Prisms can be calculated and downloaded to the bandpass filter on the FPGA, along with the linearly spaced sine and cosine values for the modulation functions.

A number of embodiments have been implemented to evaluate the performance of the Prism-based bandpass filtering system in an FPGA implementation. In the exemplary setup, the signal generator used was an Agilent 33522B Waveform Generator; a reference clock signal was shared between the Agilent and the test system to ensure timing consistency.

The first two examples have the following common characteristics: a sample rate of 2 MHz, a central frequency of 5000 Hz, and a passband of 0.02 Hz. This results in a bandpass filter of order 192 million samples, and an equivalent DSP performance of 384 TMAC/s.

Figure 23A:
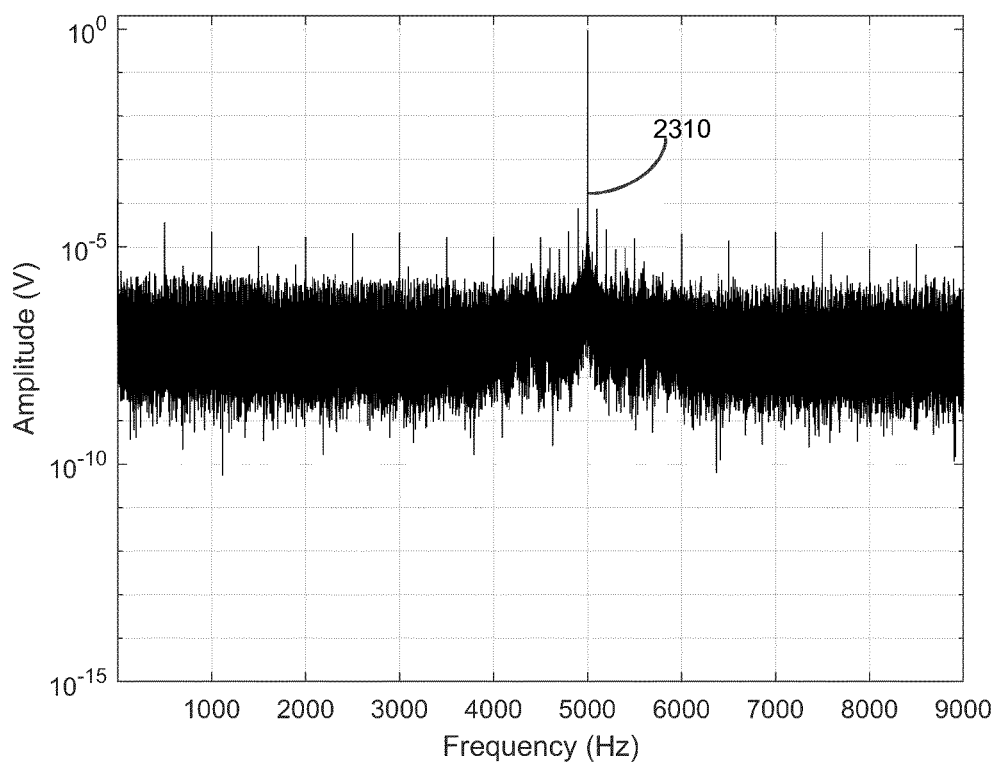
FIG. 23A shows an exemplary input spectrum.
Figure 23B:
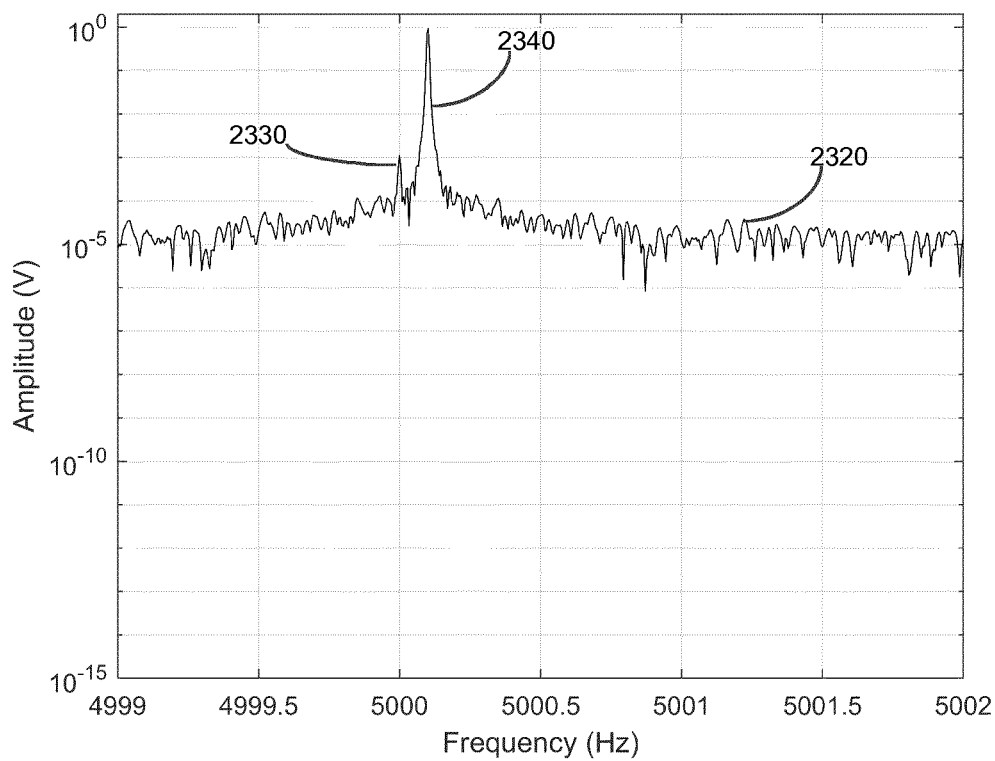
FIG. 23B shows the exemplary input spectrum FIG. 23A in a close-up view.

In both examples, the frequency component to be tracked is at 5000 Hz, with an amplitude of 1 mV zero-peak. In the first example, the interference signal, which is added to the desired signal, is at 5000.1 Hz (e.g., at a distance 5b from the central frequency, c) and has an amplitude of 1 V zero-peak, e.g, 1000 times greater than the adjacent signal component to be tracked. FIGS. 23A and 23B (close-up) show the frequency spectrum 2310, 2320 of the combined input signal around the central frequency 5000 Hz; the two adjacent frequency components 2330 and 2340 with their respective amplitudes can be observed.

Figure 24A:
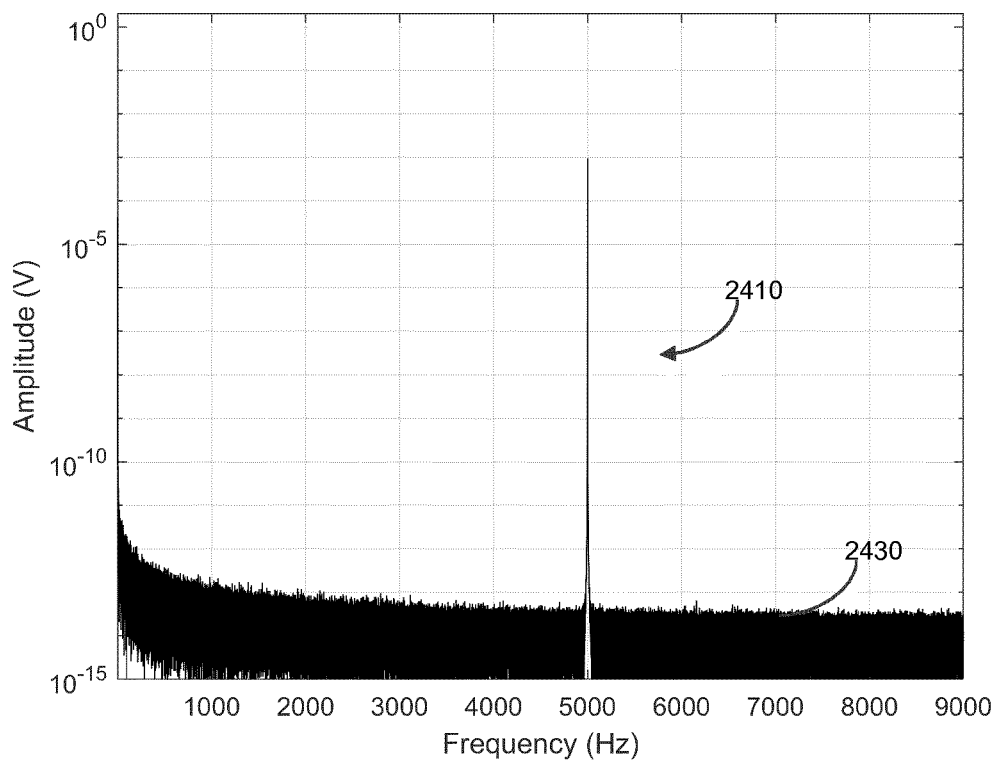
FIG. 24A shows an exemplary filtered spectrum corresponding to the input spectrum in FIGS. 23A and 23B.
Figure 24B:
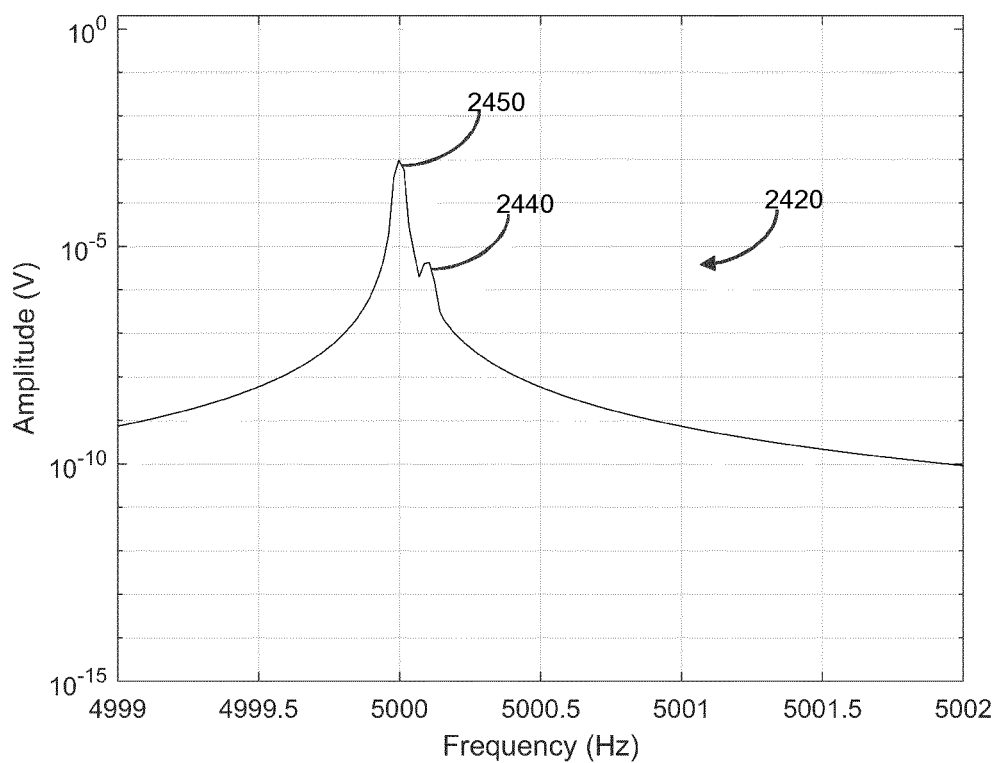
FIG. 24B shows the exemplary filtered spectrum FIG. 24A in a close-up view.
Figure 25:
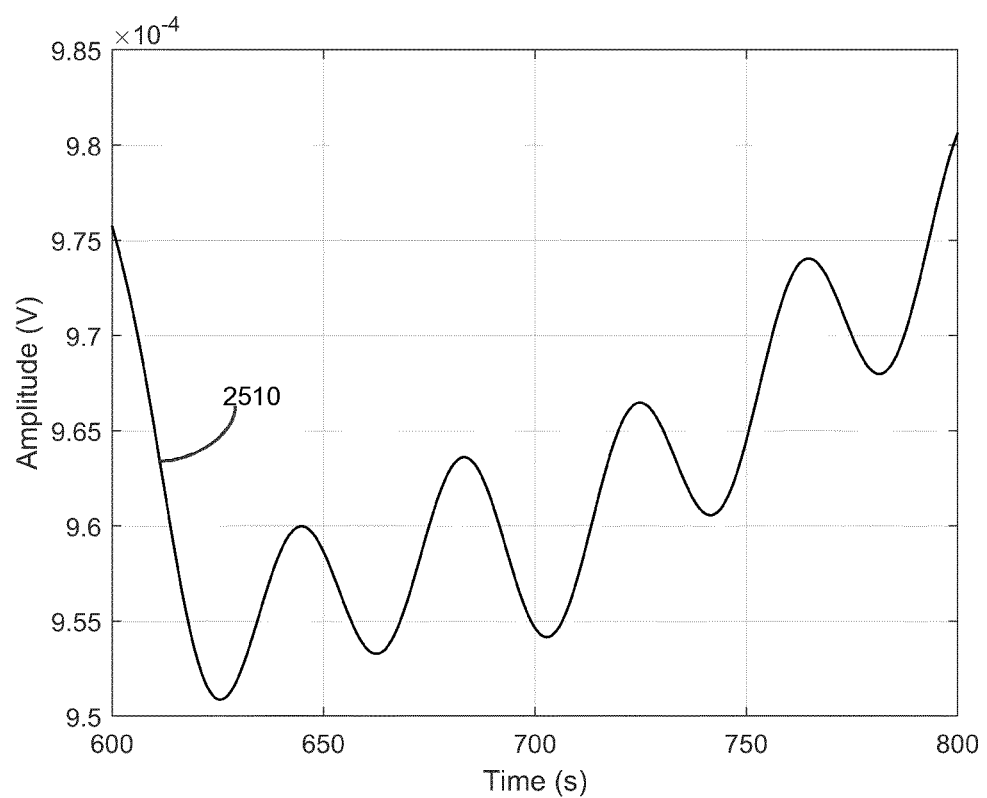
FIG. 25 shows the amplitude value calculated by an exemplary tracker from the filtered signal in FIGS. 24A and 24B.
Figure 26A:
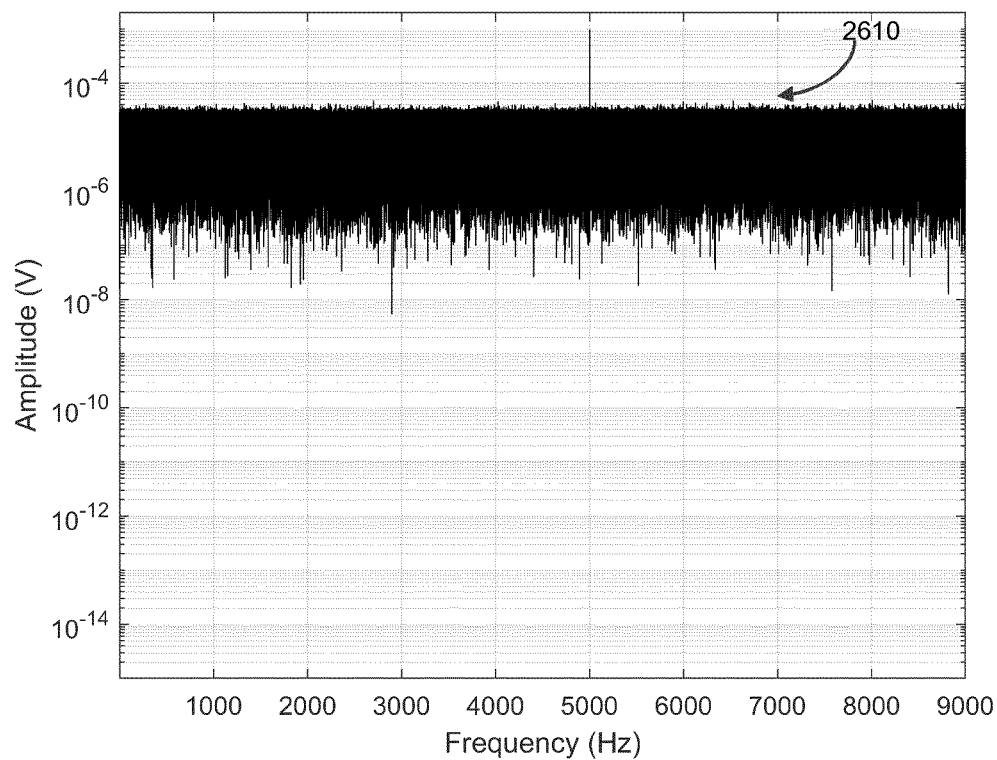
FIG. 26A shows an exemplary input spectrum with white noise.
Figure 26B:
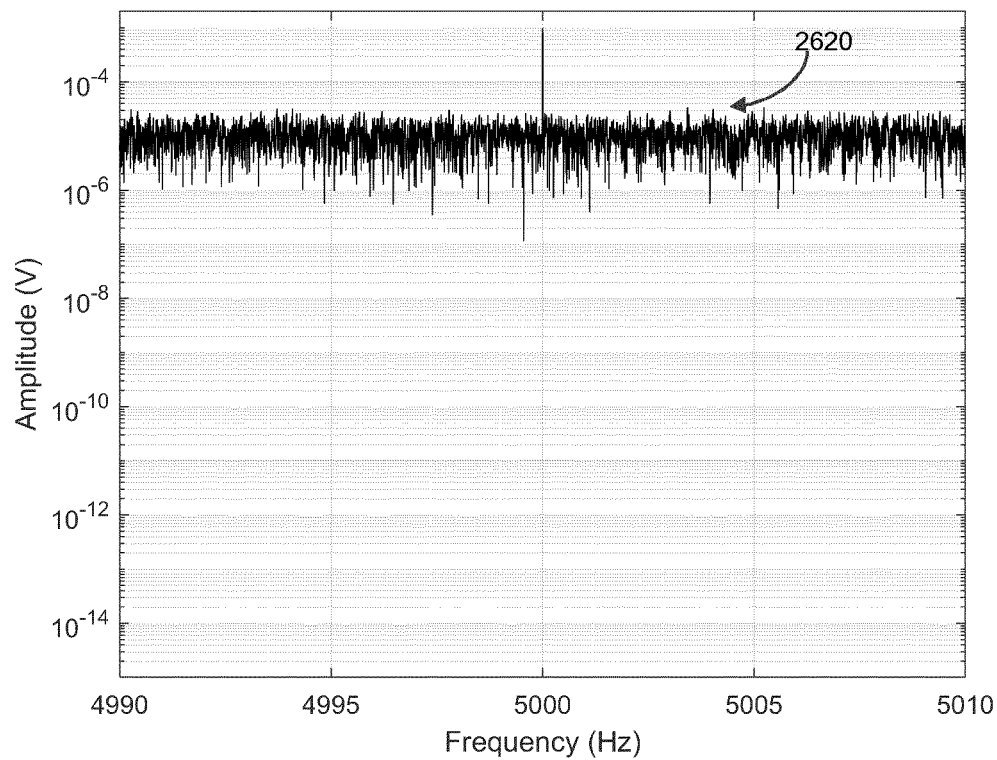
FIG. 26B shows the exemplary input spectrum with white noise FIG. 26A in a close-up view.
Figure 27A:
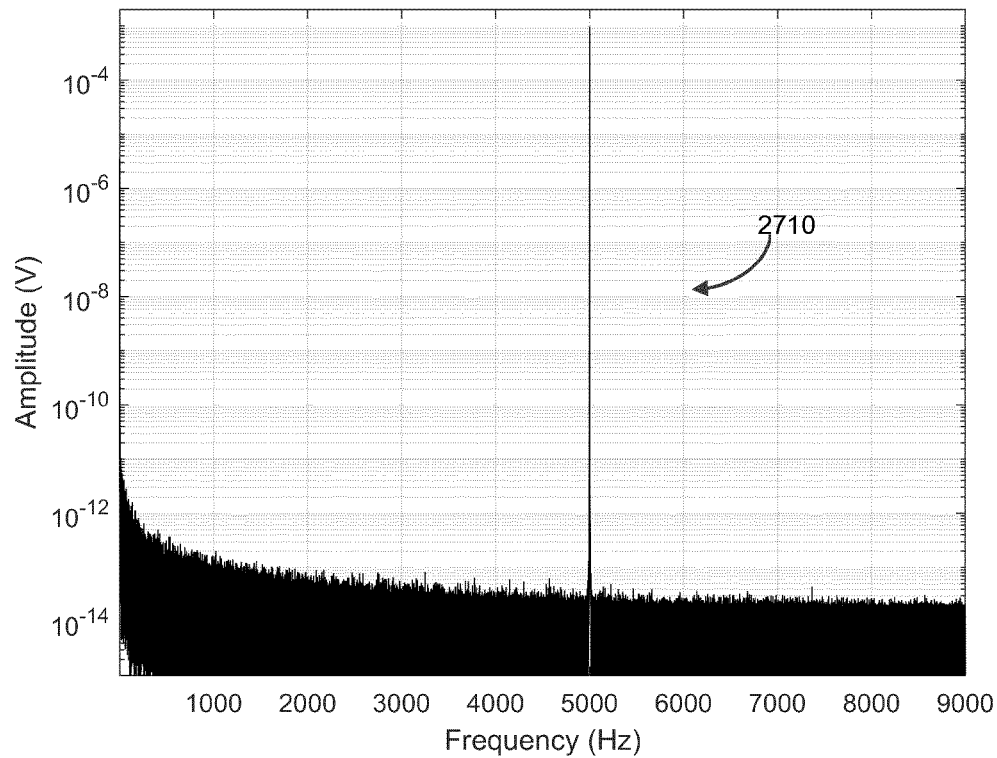
FIG. 27A shows an exemplary filtered spectrum corresponding to the input spectrum in FIGS. 26A and 26B.
Figure 27B:
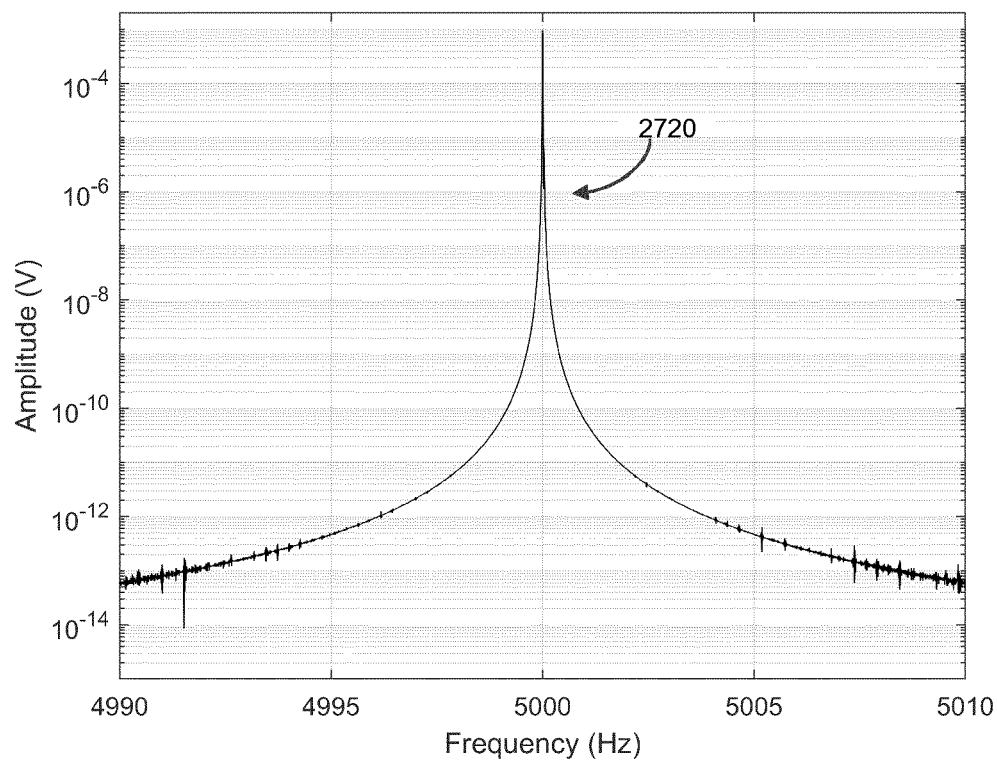
FIG. 27B shows the exemplary filtered spectrum FIG. 27A in a close-up view.

FIGS. 24A and 24B (close-up) show the frequency spectrum 2410, 2420 of the bandpass filtered signal. The noise floor 2430, which in FIGS. 23A and 23B appears steady at around 1e-5 V, has dropped to around 1e-11 V at a distance of 0.5 Hz or greater from the central frequency c. As intended, the interfering signal at 5000.1 Hz 2440 has been effectively attenuated, leaving the desired signal component at 5000 Hz as the highest peak 2450. FIG. 25 shows the amplitude 2510 calculated by the RST which remains within 5% of its true value of 1 mV.

Figure 28:
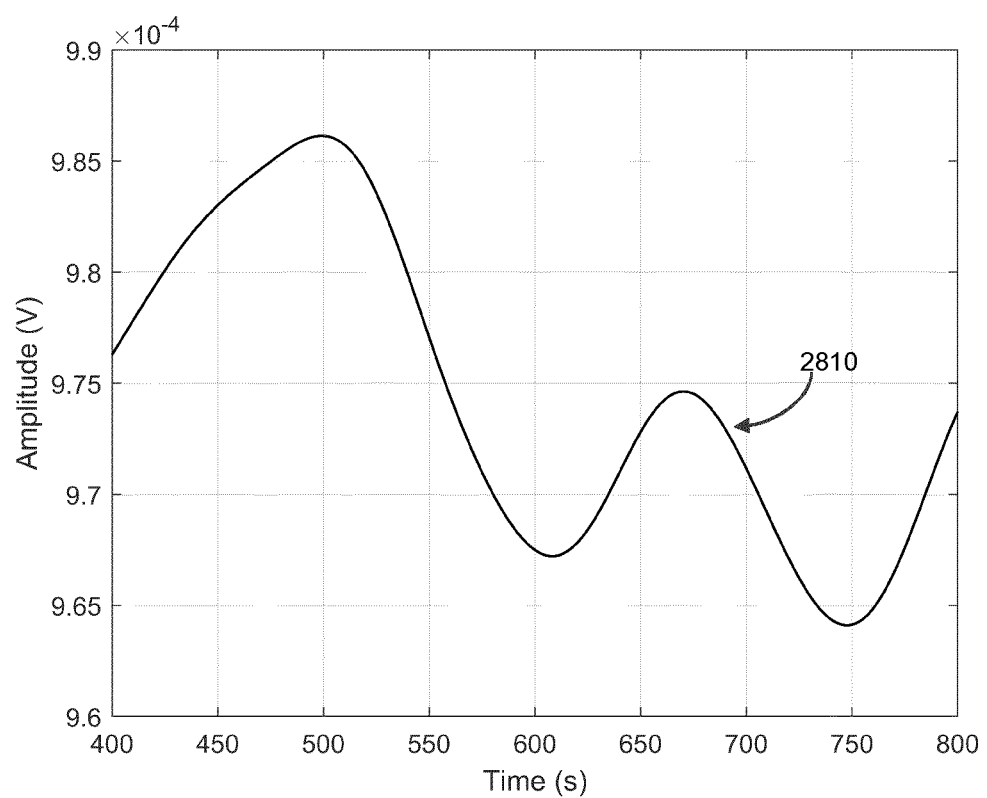
FIG. 28 shows the amplitude value calculated by an exemplary tracker from the filtered signal in FIGS. 27A and 27B.

FIGS. 26A, 26B, 27A, 27B, and 28 are equivalent plots for the second example using b=0.02 Hz, where the interference signal comprises white noise with an amplitude of 0.5 V and a bandwidth of 10 MHz. As shown in FIGS. 26A, 26B and 27A, 27B, respectively, these conditions can result in a higher noise floor and a smoother filtered spectrum. As FIG. 28 shows, similar performance for amplitude tracking can be achieved.

While this first pair of examples can demonstrate a very narrow passband filter and high DSP performance, the dynamic response of the exemplary filter is on the order of 100 seconds, which can limit its ability to demonstrate the tracking of any change in component values. Accordingly, a second pair of examples is given that is largely similar to the first, but where the filter bandwidth is extended so that step changes in the amplitude of the tracked signal component can be observed more readily.

In the second pair of examples, the sampling rate remains 2 MHz and the bandpass central frequency c remains 5000 Hz, but the bandwidth b is increased to 0.1 Hz. The corresponding filter order is 38 million samples, so the DSP performance is 76 G MAC/s.

Figure 29A:
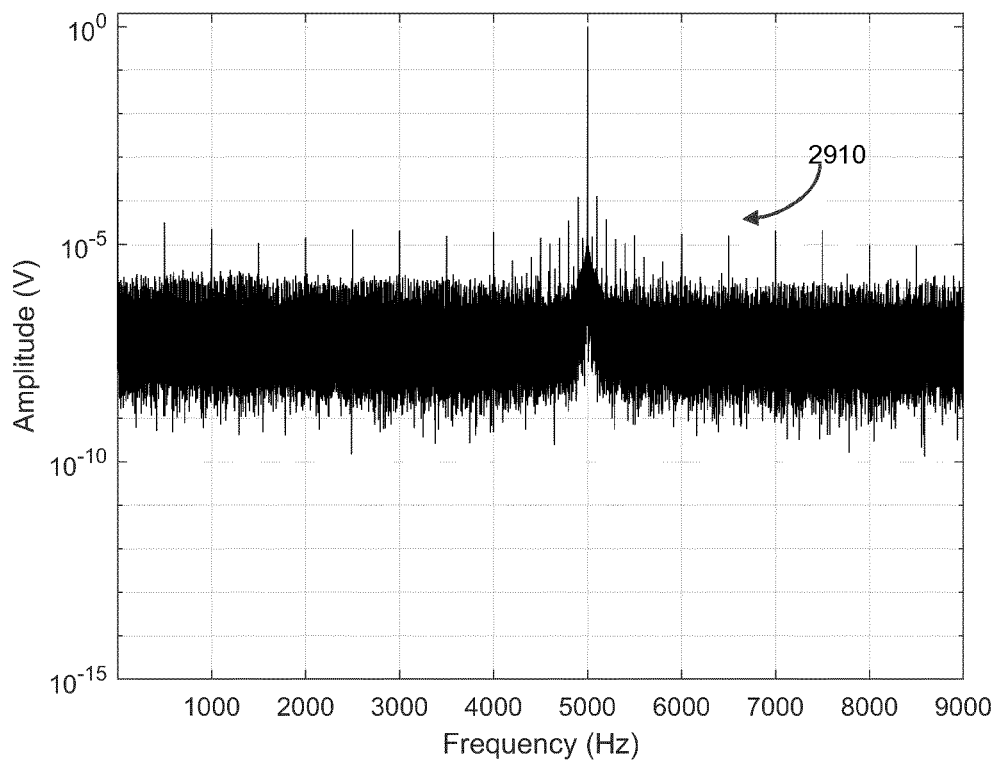
FIG. 29A shows another exemplary input spectrum.
Figure 29B:
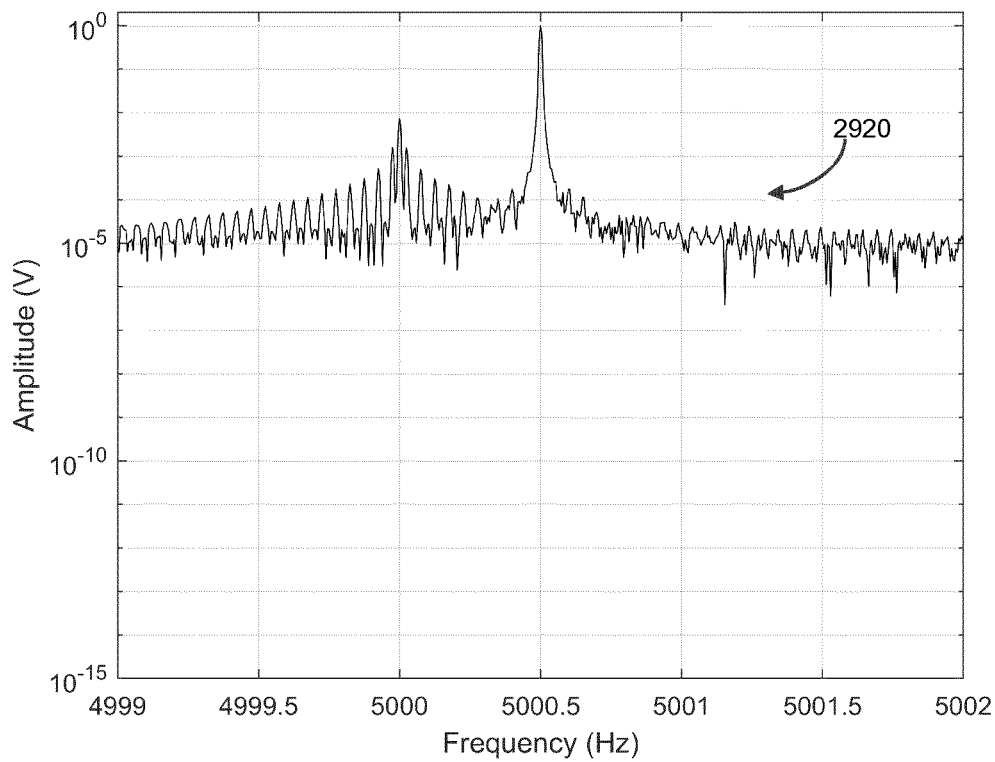
FIG. 29B shows the exemplary input spectrum FIG. 29A in a close-up view.
Figure 30A:
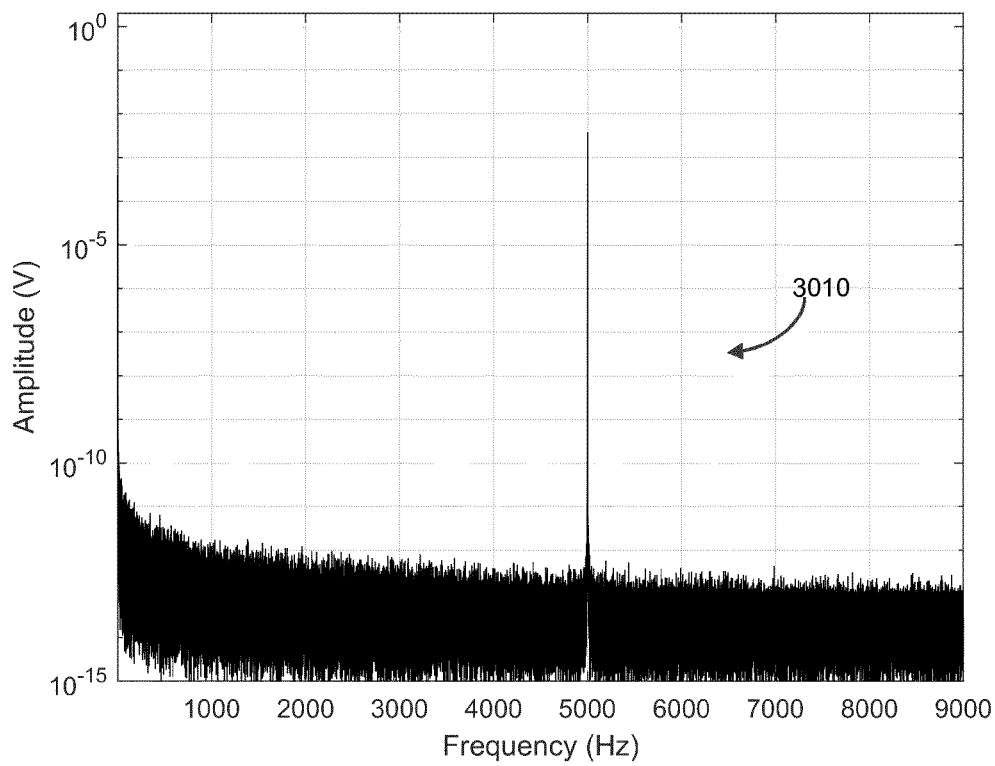
FIG. 30A shows an exemplary filtered spectrum corresponding to the input spectrum in FIGS. 29A and 29B.
Figure 30B:
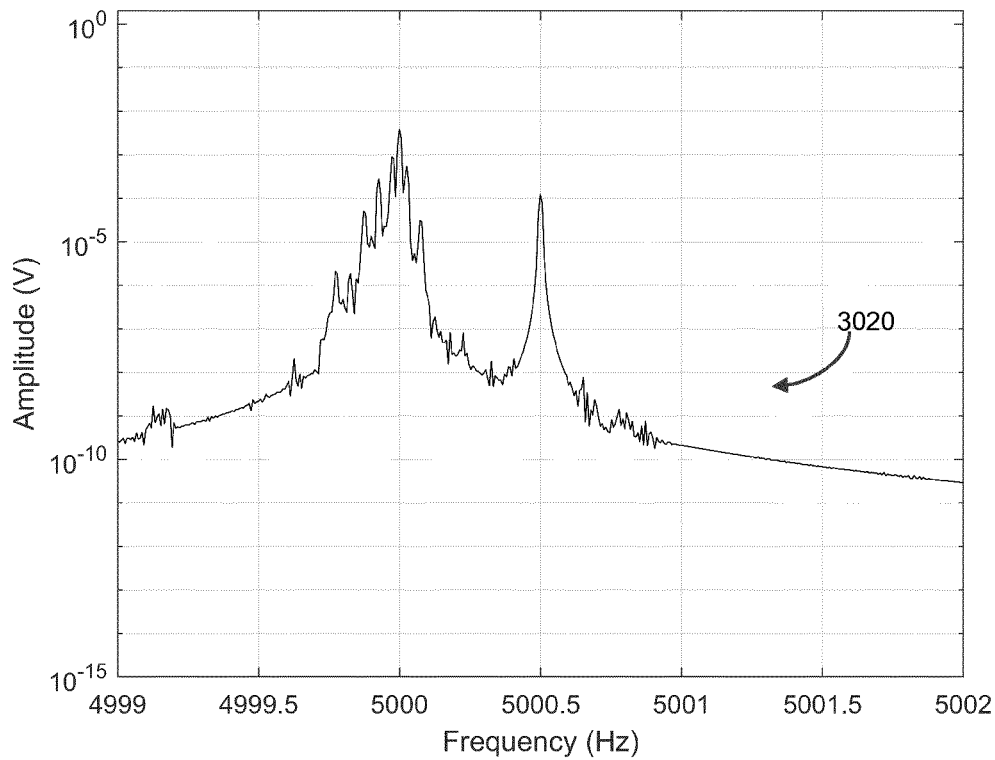
FIG. 30B shows the exemplary filtered spectrum FIG. 30A in a close-up view.
Figure 31:
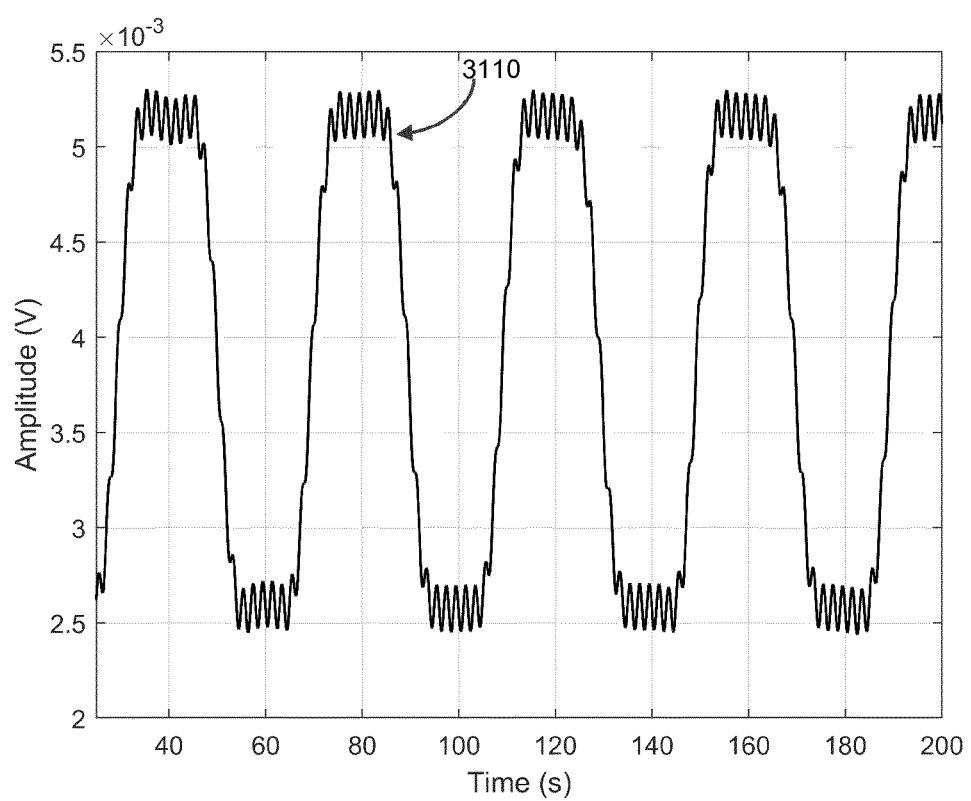
FIG. 31 shows the amplitude value calculated by an exemplary tracker from the filtered signal in FIGS. 30A and 30B.
Figure 32A:
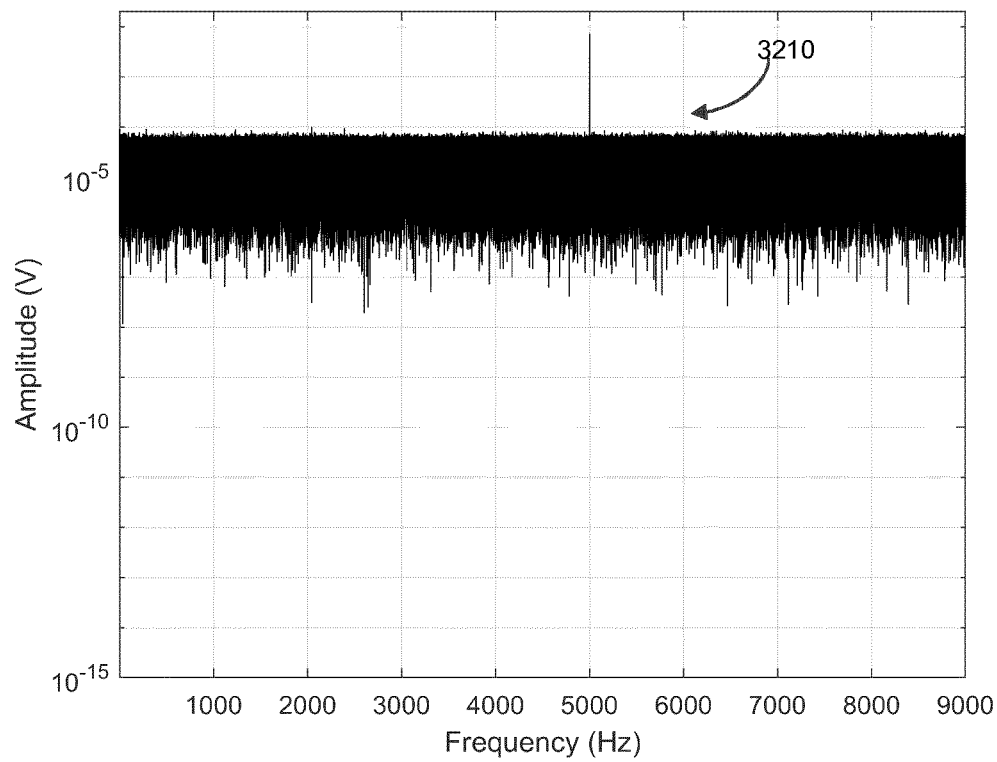
FIG. 32A shows another exemplary input spectrum with white noise.
Figure 32B:
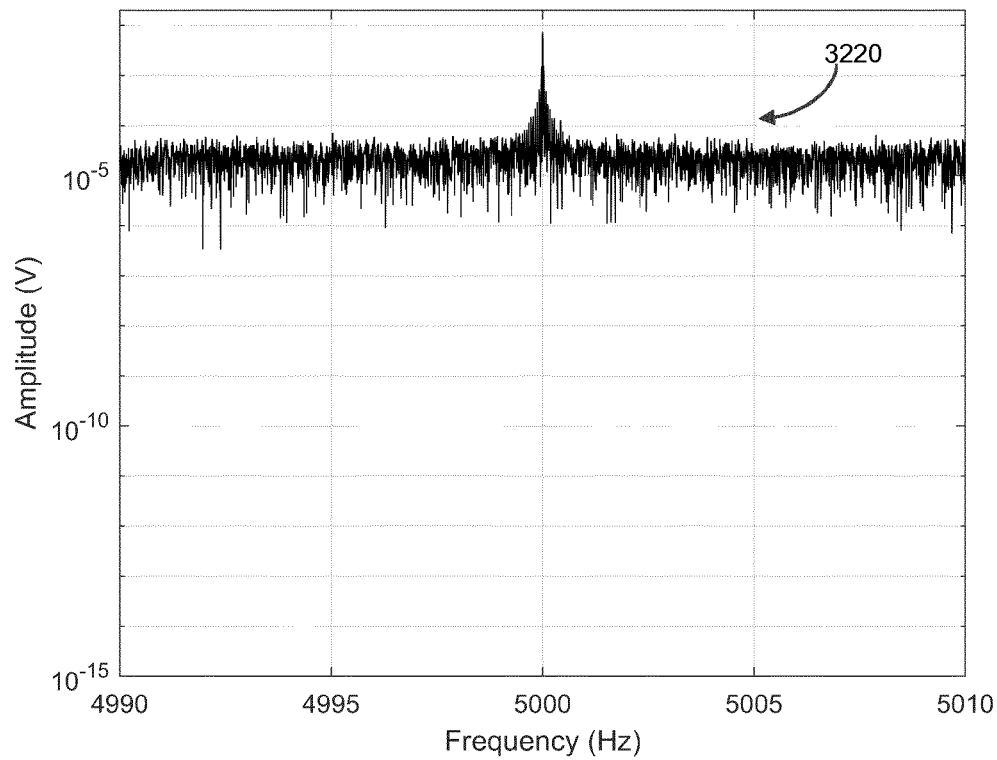
FIG. 32B shows the exemplary input spectrum with white noise FIG. 32A in a close-up view.
Figure 33A:
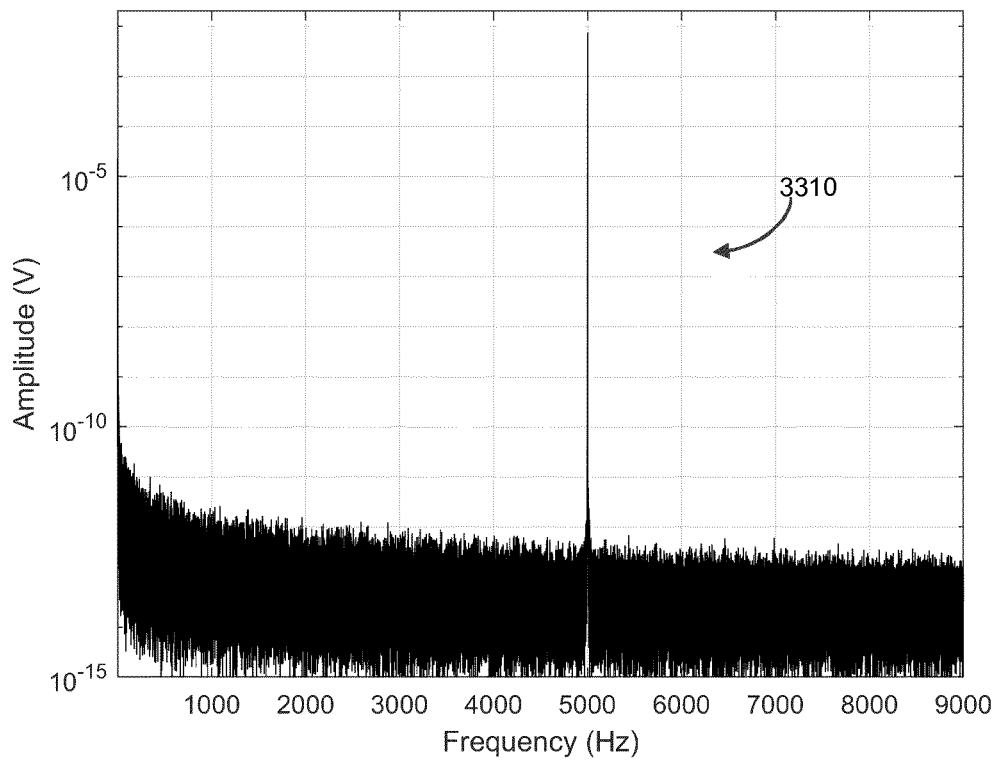
FIG. 33A shows an exemplary filtered spectrum corresponding to the input spectrum in FIGS. 32A and 32B.
Figure 33B:
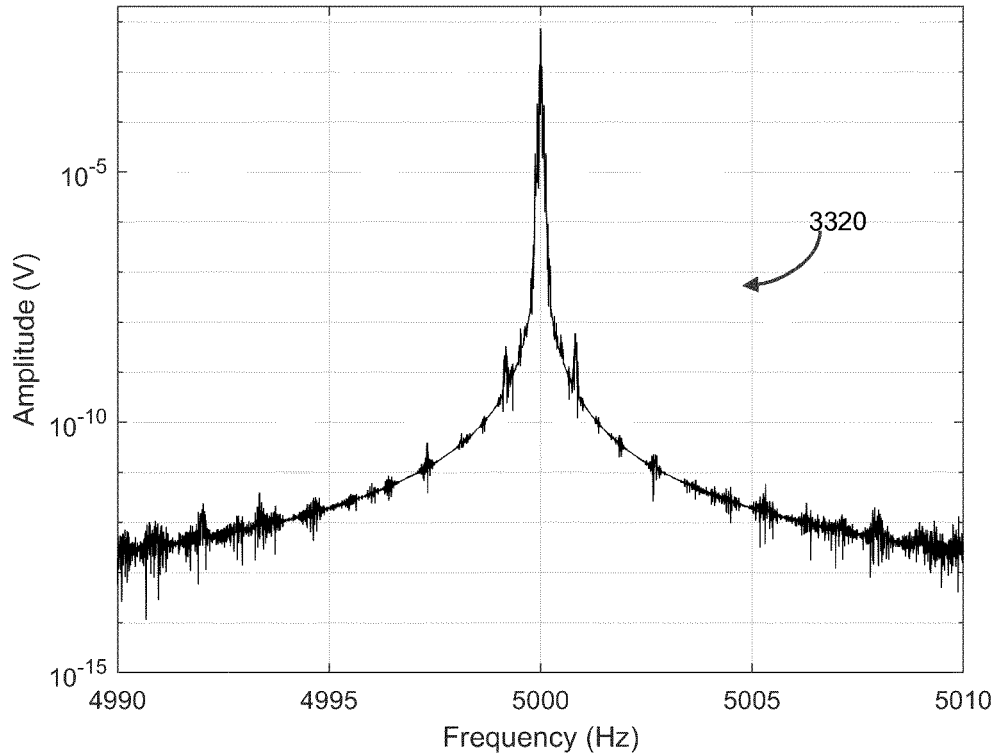
FIG. 33B shows the exemplary filtered spectrum FIG. 33A in a close-up view.

In the first of these examples, the 5000 Hz frequency components steps between 2.5 mV and 5 mV every 20 seconds, while the interference component is at 5000.5 Hz (e.g., 5b away) with an amplitude of 1 V. FIGS. 29A and 29B (close-up) show the spectrum 2910, 2920 of the input signal, which has additional peaks at intervals of 0.05 Hz due to the amplitude step changes. The spectrum 3010, 3020 of the filter output in FIGS. 30A and 30B (close-up) show that the frequency component at 5000.5 Hz has been significantly attenuated. Finally, in FIG. 31, the tracker output signal 3110 shows the amplitude step changes every 20 second. This demonstrates that the filter-and-tracker embodiment is able to track changes in an input signal in the presence of a large interference.

Figure 34:
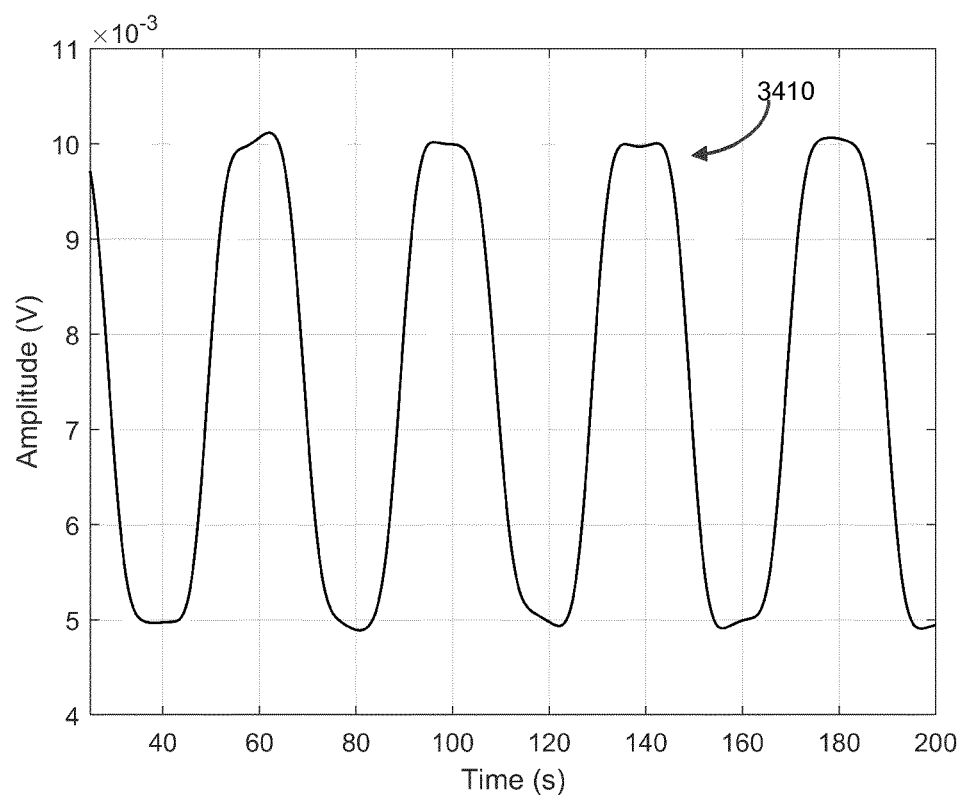
FIG. 34 shows the amplitude value calculated by an exemplary tracker from the filtered signal in FIGS. 33A and 33B.

The second example also uses 1 V of white noise, while the 5000 Hz component amplitude steps between 10 mV and 20 mV every 20 seconds. FIGS. 32A, 32B and 33A, 33B show the spectra 3210 and 3220, 3310 and 3320 of the input signal and filter output, respectively. FIG. 34 demonstrates that the step changes in the 5000 Hz signal 3410 are successfully tracked.

This disclosure describes an implementation of Prism-based bandpass filter embodiments using an FPGA card and a PC host. As described, filters with orders as high as 192 million samples can be designed in real time and instantiated on the FPGA. Experimental results using a signal generator demonstrate that the bandpass filters can be effective in isolating desired signal components and removing unwanted components. While the Artix-7 FPGA DSP performance is rated at less than 1 TMAC/s, the recursive FIR Prism-based filters achieve an equivalent DSP performance of up to 384 TMAC/s, using only a fraction of the resources of the FPGA.

Additional Information

The term 'block,' 'stage block,' 'integration stage block' or 'signal processing block' may be used throughout these disclosures to indicate some means of performing a numerical calculation, whether by hardware, software, or other means. The term is not meant to imply any restriction in the computational architecture, methodology or instantiation; it is simply a convenient label to identify and discuss the various method or system steps presented in this disclosure.

The various illustrative logical blocks, modules, and processes described herein may be implemented or performed by a machine, such as a computer, a processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor may be a microprocessor, a controller, microcontroller, state machine, combinations of the same, or the like. A processor may also be implemented as a combination of computing devices, e.g., a combination of a DSP and a microprocessor, a plurality of microprocessors or processor cores, one or more graphics or stream processors, one or more microprocessors in conjunction with a DSP, or any other such configuration.

Further, certain implementations of the Prism-based filter of the present disclosure are sufficiently mathematically, computationally, or technically complex that application-specific hardware (e.g., FPGAs or ASICs) or one or more physical computing devices (utilizing appropriate executable instructions) may be necessary to perform the functionality, for example, due to the volume or complexity of the calculations involved (e.g., filtering and tracking a signal in a low signal-to-noise environment) or to provide results (e.g., tracked signal) substantially in real-time.

The blocks or states of the processes described herein may be embodied directly in hardware, in a software module stored in a non-transitory memory and executed by a hardware processor, or in a combination of the two. For example, each of the processes described above may also be embodied in, and fully automated by, software modules (stored in a non-transitory memory) executed by one or more machines such as computers or computer processors. A module may reside in a non-transitory computer readable medium such as RAM, flash memory, ROM, EPROM, EEPROM, registers, hard disk, an optical disc, memory capable of storing firmware, or any other form of computer-readable (e.g., storage) medium. A computer-readable medium can be coupled to a processor such that the processor can read information from, and write information to, the computer-readable medium. In the alternative, the computer-readable medium may be integral to the processor. The processor and the computer-readable medium may reside in an ASIC. The computer-readable medium may include non-transitory data storage (e.g., a hard disk, non-volatile memory, etc.).

The processes, methods, and systems may be implemented in a network (or distributed) computing environment. For example, the computing device may be implemented in a distributed, networked, computing environment. Network environments include enterprise-wide computer networks, intranets, local area networks (LAN), wide area networks (WAN), personal area networks (PAN), cloud computing networks, crowd-sourced computing networks, the Internet, and the World Wide Web. The network may be a wired or a wireless network, a terrestrial or satellite network, or any other type of communication network.

Depending on the embodiment, certain acts, events, or functions of any of the processes or methods described herein can be performed in a different sequence, may be added, merged, or left out altogether. Thus, in certain embodiments, not all described acts or events are necessary for the practice of the processes. Moreover, in certain embodiments, acts or events may be performed concurrently, e.g., through multi-threaded processing, interrupt processing, or via multiple processors or processor cores, rather than sequentially. In any apparatus, system, or method, no element or act is necessary or indispensable to all embodiments, and the disclosed apparatus, systems, and methods can be arranged differently than shown or described.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Conjunctive language such as the phrase "at least one of X, Y and Z," unless specifically stated otherwise, is otherwise understood with the context as used in general to convey that an item, term, etc. may be either X, Y or Z. Thus, such conjunctive language is not generally intended to imply that certain embodiments require at least one of X, at least one of Y and at least one of Z to each be present. The articles "a" or "an" or "the" when referring to an element means one or more of the element, unless the context clearly indicates otherwise.

While the above detailed description has shown, described, and pointed out novel features as applied to various embodiments, it will be understood that various omissions, substitutions, and changes in the form and details of the logical blocks, modules, and processes illustrated may be made without departing from the spirit of the disclosure. As will be recognized, certain embodiments described herein may be embodied within a form that does not provide all of the features and benefits set forth herein, as some features may be used or practiced separately from others.

While these techniques have been developed primarily with real-time signal processing, many of them are also applicable to off-line analysis of signals.

The invention claimed is:

1. A method of applying a bandpass filter, comprising:
   instantiating a sequence of one or more Prism pairs in each Prism pair are characterized by a common harmonic number (h) and two different characteristic frequencies ($m_1$, $m_2$);
   selecting a bandwidth (b) of the bandpass filter;
   selecting a central frequency (c) of the bandpass filter;
   calculating, based on the bandwidth (b) and the central frequency (c), a value of the harmonic number (h) of each Prism pair; and
   calculating, based on the central frequency (c) and the harmonic number (h) of each Prism pair, values of the two characteristic frequencies ($m_1$, $m_2$) of each Prism pair.

2. The method of claim 1, wherein said calculating the values of the two characteristic frequencies ($m_1$, $m_2$) comprises selecting a value that produces a maximum frequency response at or near the central frequency (c) and selecting a value that produces a minimum frequency response at or near the central frequency (c).

3. The method of claim 1, wherein said calculating the values of the two characteristic frequencies ($m_1$, $m_2$) includes calculating the characteristic frequency ($m_1$) based on an equation $m_1=c/(h+E_1)$ and calculating the characteristic frequency ($m_2$) based on an equation $m_2=c/(h-E_2)$, where $E_1$ and $E_2$ are constants.

4. The method of claim 3, wherein values of the constants $E_1$ and $E_2$ depend on the value of the harmonic number (h).

5. The method of claim 3, wherein the values of the constants $E_1$ and $E_2$ are both approximately 0.371, and wherein the value of the harmonic number (h) is greater than 20.

6. The method of claim 1, wherein the two characteristic frequencies ($m_1$, $m_2$) correspond to Prism integral lengths that are integer numbers of samples.

7. The method of claim 1, wherein the sequence of Prism pairs comprises a plurality of Prism pairs, and further comprising:
selecting a ratio value for each of the plurality of Prism pairs.

8. The method of claim 7, wherein said calculating the value of the harmonic number (h) of each Prism pair is based on an integer rounding function of round(F×c/b×G), wherein G is the ratio value for the Prism pair, and F depends on a set of the ratio values and a minimum gain of the bandpass filter within a passband of the bandpass filter, wherein the passband extends from (c−b/2) to (c+b/2).

9. The method of claim 7, wherein the plurality of Prism pairs consists of three Prism pairs.

10. The method of claim 9, wherein said selecting the ratio value for each of three Prism pairs comprises selecting one of three integer values 6, 4, and 3.

11. The method of claim 10, wherein said calculating the value of the harmonic number (h) of each of the three Prism pairs is based on an equation h=round(0.0371×c/b×G), wherein round is an integer rounding function, and G is the ratio value.

12. The method of claim 1, further comprising:
applying a signal at an input of the bandpass filter;
obtaining a signal at an output of the bandpass filter; and
calculating one or more of frequency, amplitude, power, and phase values of the signal obtained at the output of the bandpass filter.

13. A system for applying a bandpass filter comprising means for carrying out the method of claim 1.

14. An apparatus for bandpass filtering, comprising:
one or more Prism pairs means concatenated in series, wherein two Prism filters means in each Prism pair means are characterized by a common harmonic number (h) and two different characteristic frequencies ($m_1$, $m_2$).

15. The apparatus of claim 14, wherein the two characteristic frequencies ($m_1$, $m_2$) correspond to a value that produces a positive peak in a frequency response of the apparatus for bandpass filtering at or near a central frequency (c) of the apparatus and a value that produces a negative peak in the frequency response at or near the central frequency (c).

16. The apparatus of claim 14, wherein at least one Prism pair is implemented through computer instructions.

17. The apparatus of claim 14, wherein at least one Prism pair is implemented through electronic circuit means.

18. A system for signal tracking, comprising:
a bandpass filter means, comprising:
an input means;
one or more Prism pair means being concatenated in series, wherein two Prism filter means in each Prism pair means are characterized by a common harmonic number (h) and two different characteristic frequencies ($m_1$, $m_2$), wherein the harmonic number (h) and the characteristic frequencies ($m_1$, $m_2$) are determined based on a bandwidth (b) of the bandpass filter means and a central frequency (c) of the bandpass filter means; and
an output means; and
a processing means being coupled to the output means of the bandpass filter means to obtain an output signal from the bandpass filter means and calculating one or more of frequency, amplitude, power, and phase values of the output signal.

19. The system of claim 18, wherein each of the two characteristic frequencies ($m_1$, $m_2$) is determined based on a frequency response of the bandpass filter means.

20. The system of claim 18, wherein the harmonic number (h) is based on a ratio of the central frequency (c) to the bandwidth (b).

* * * * *